(12) United States Patent
Lee et al.

(10) Patent No.: US 11,469,148 B2
(45) Date of Patent: Oct. 11, 2022

(54) SEMICONDUCTOR PACKAGE HAVING A REDISTRIBUTION LAYER FOR PACKAGE-ON-PACKAGE STRUCTURE

(71) Applicant: SAMSUNG ELECTRONICS CO., LTD., Suwon-si (KR)

(72) Inventors: Youngkwan Lee, Suwon-si (KR); Youngsik Hur, Suwon-si (KR); Taehee Han, Suwon-si (KR); Yonghoon Kim, Suwon-si (KR); Yuntae Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 415 days.

(21) Appl. No.: 16/681,341

(22) Filed: Nov. 12, 2019

(65) Prior Publication Data

US 2020/0168518 A1 May 28, 2020

(30) Foreign Application Priority Data

Nov. 27, 2018 (KR) .................. 10-2018-0148324

(51) Int. Cl.
*H01L 23/495* (2006.01)
*H01L 23/31* (2006.01)
(Continued)

(52) U.S. Cl.
CPC .... *H01L 23/3114* (2013.01); *H01L 23/49811* (2013.01); *H01L 23/49861* (2013.01);
(Continued)

(58) Field of Classification Search
CPC .......... H01L 23/3114; H01L 23/49811; H01L 23/49861; H01L 24/05; H01L 24/45;
(Continued)

(56) References Cited

U.S. PATENT DOCUMENTS 9,978,731 B1* 5/2018 Kim .................. H01L 23/3128
2016/0111398 A1* 4/2016 Hsiao ................ H01L 23/5389
438/386

(Continued)

FOREIGN PATENT DOCUMENTS

KR 10-2018-0024834 A 3/2018
KR 10-1922884 B1 11/2018

*Primary Examiner* — Duy T Nguyen
*Assistant Examiner* — Dilinh P Nguyen
(74) *Attorney, Agent, or Firm* — Sughrue Mion, PLLC

(57) ABSTRACT

A semiconductor package includes: a frame having a cavity and including a wiring structure connecting first and second surfaces of the frame; a first connection structure on the first surface of the frame and including a first redistribution layer connected to the wiring structure; a first semiconductor chip on the first connection structure within the cavity; an encapsulant encapsulating the first semiconductor chip and covering the second surface of the frame; a second connection structure including a second redistribution layer including a first redistribution pattern and first connection vias; and a second semiconductor chip disposed on the second connection structure and having connection pads connected to the second redistribution layer.

18 Claims, 25 Drawing Sheets

(51) Int. Cl.
  *H01L 23/498* (2006.01)
  *H01L 23/00* (2006.01)
(52) U.S. Cl.
  CPC .............. *H01L 24/05* (2013.01); *H01L 24/45* (2013.01); *H01L 2224/02372* (2013.01)
(58) Field of Classification Search
  CPC ........... H01L 24/19; H01L 2224/04105; H01L 2224/32145; H01L 2224/48227; H01L 2224/48228; H01L 2224/73265; H01L 23/5389; H01L 25/0657; H01L 2924/181; H01L 23/49827; H01L 23/3135; H01L 23/5226; H01L 24/06
  USPC ......................................................... 257/667
  See application file for complete search history.

(56) References Cited

U.S. PATENT DOCUMENTS

| | | |
|---|---|---|
| 2016/0276311 A1 | 9/2016 | Meyer et al. |
| 2018/0061794 A1* | 3/2018 | Kim ........................ H01L 24/19 |

* cited by examiner

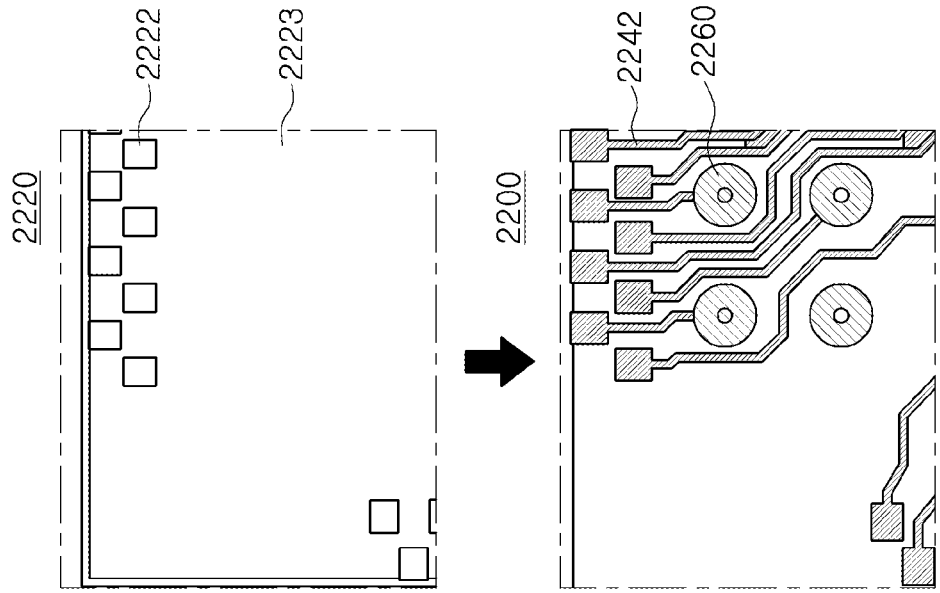
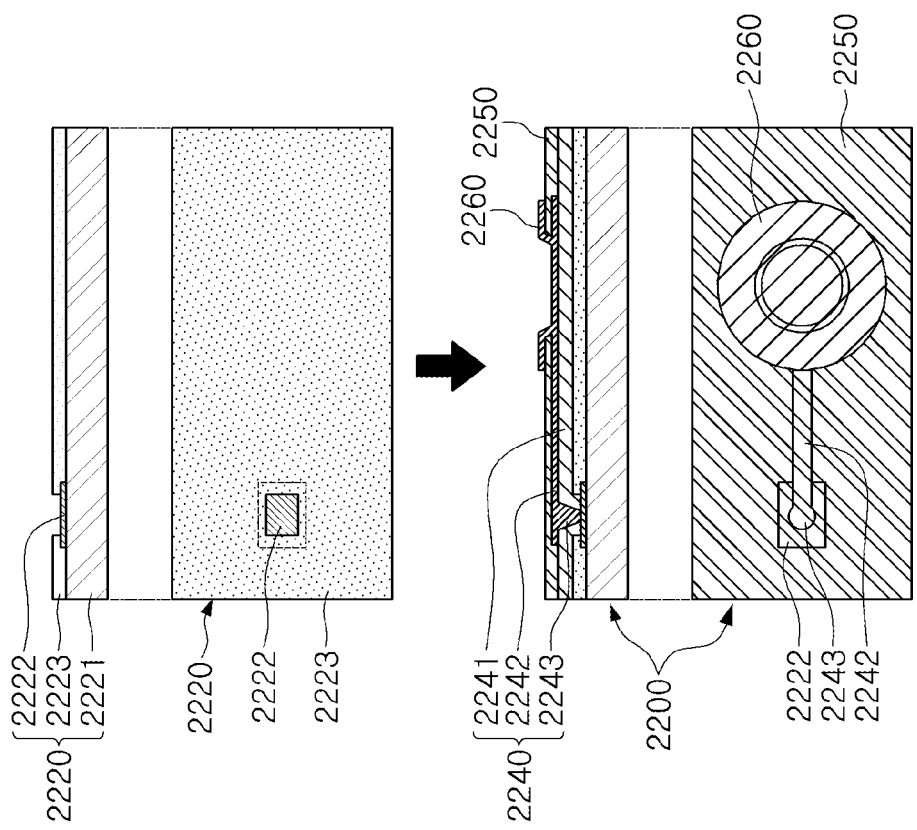
FIG. 3B
FIG. 3A

I-I'

II-II'

SEMICONDUCTOR PACKAGE HAVING A REDISTRIBUTION LAYER FOR PACKAGE-ON-PACKAGE STRUCTURE

CROSS-REFERENCE TO RELATED APPLICATION(S)

This application claims benefit of priority to Korean Patent Application No. 10-2018-0148324 filed on Nov. 27, 2018 in the Korean Intellectual Property Office, the disclosure of which is incorporated herein by reference in its entirety.

TECHNICAL FIELD

The present disclosure relates to a semiconductor package.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size while including a plurality of pins, has been demanded.

One type of package technology suggested to satisfy the technical demand as described above may be a fan-out semiconductor package. Such a fan-out semiconductor package has a compact size and may allow a plurality of pins to be implemented by redistributing connection terminals up to a region that is out of a region overlapping a semiconductor chip. A backside redistribution layer (RDL) may be required in order to implement a semiconductor package having a package-on-package (POP) structure.

SUMMARY

An aspect of the present disclosure may provide a semiconductor package having a redistribution layer useful for a package-on-package (POP) structure.

According to an aspect of the present disclosure, a semiconductor package may include: a frame having a cavity and including a wiring structure connecting first and second surfaces of the frame to each other, the first and second surfaces opposing each other; a first connection structure disposed on the first surface of the frame and including a first redistribution layer connected to the wiring structure; a first semiconductor chip disposed on the first connection structure within the cavity and having connection pads connected to the first redistribution layer; an encapsulant encapsulating the first semiconductor chip and covering the second surface of the frame; a second connection structure including a second redistribution layer including a first redistribution pattern and first connection vias, the first redistribution pattern being embedded in the encapsulant and having one surface exposed from the encapsulant, and the first connection vias penetrating through the encapsulant and connecting the wiring structure and the first redistribution pattern to each other; and a second semiconductor chip disposed on the second connection structure and having connection pads connected to the second redistribution layer.

According to another aspect of the present disclosure, a semiconductor package may include: a first semiconductor chip having an active surface having connection pads disposed thereon and an inactive surface opposing the active surface; a first connection structure disposed on the active surface of the first semiconductor chip and including a first redistribution layer connected to the connection pads; an encapsulant disposed on the first connection structure and encapsulating the first semiconductor chip; a wiring structure penetrating through the encapsulant and connected to the first redistribution layer; a second connection structure including a second redistribution layer having a redistribution pattern and connection vias, the redistribution pattern being embedded in the encapsulant and having one surface exposed from the encapsulant, and the connection vias penetrating through the encapsulant and connecting the wiring structure and the redistribution pattern to each other; and a second semiconductor chip disposed on the second connection structure and having connection pads connected to the second redistribution layer.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a downward direction in relation to cross sections of the drawings for convenience, while an upper side, an upper portion, an upper surface, and the like, are used to refer to an opposite direction to the downward direction. However, these directions are defined for convenience of explanation, and the claims are not particularly limited by the directions defined as described above, and concepts of upper and lower portions may be exchanged with each other.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
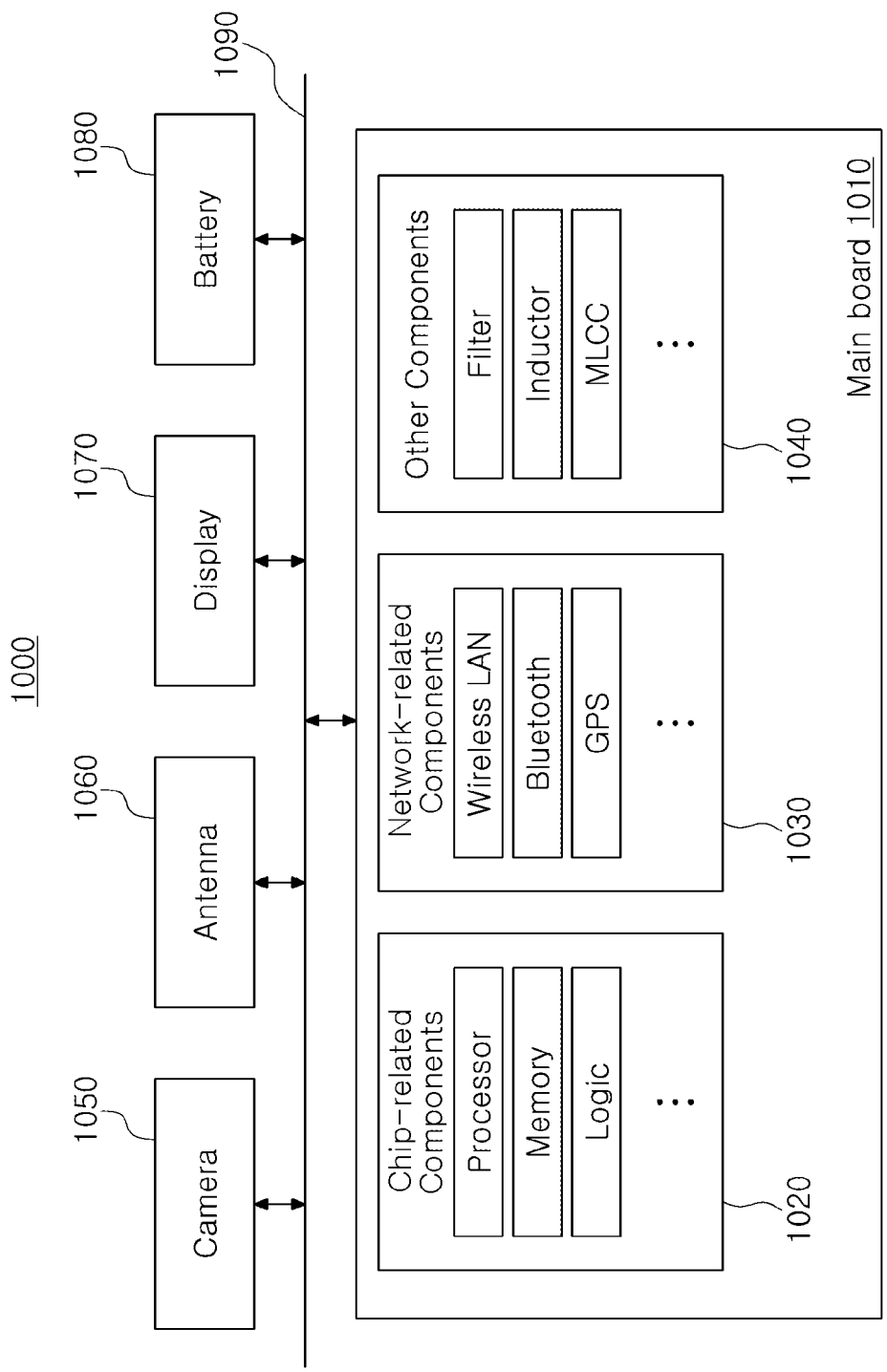
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
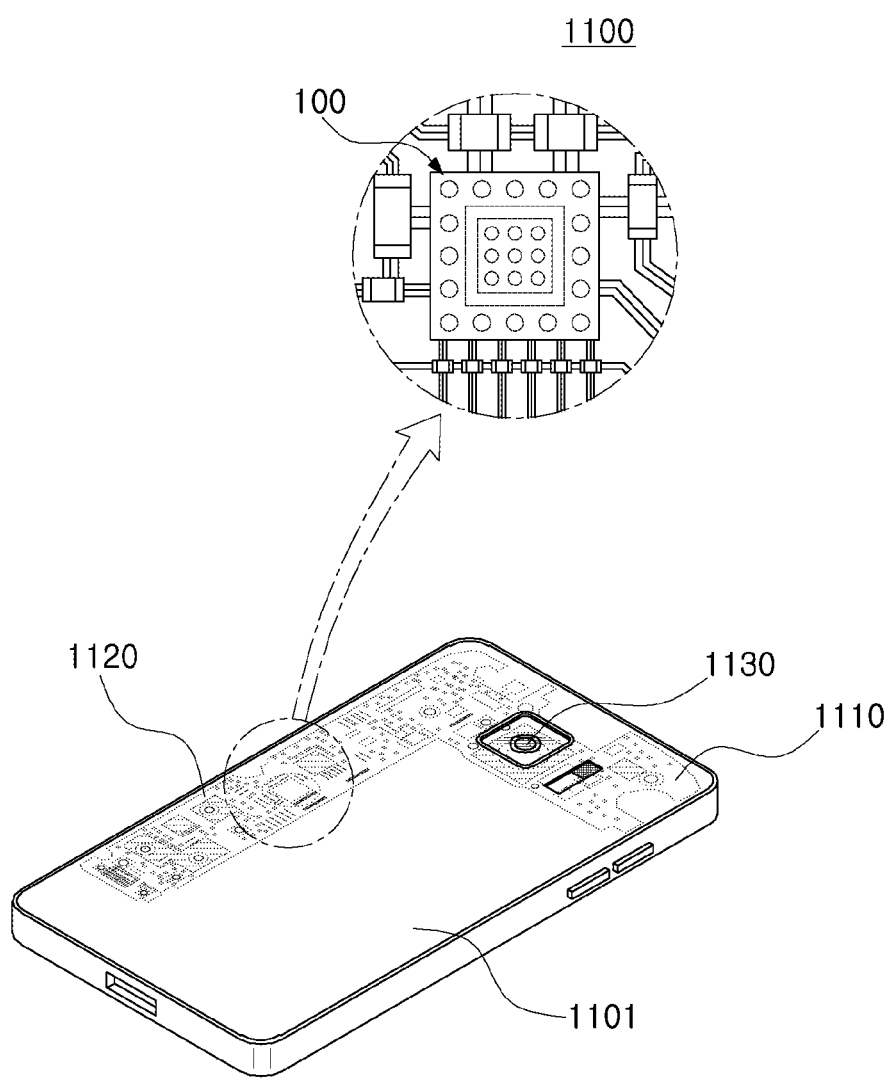
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the accompanying drawings.

Fan-in Semiconductor Package

Figure 4:
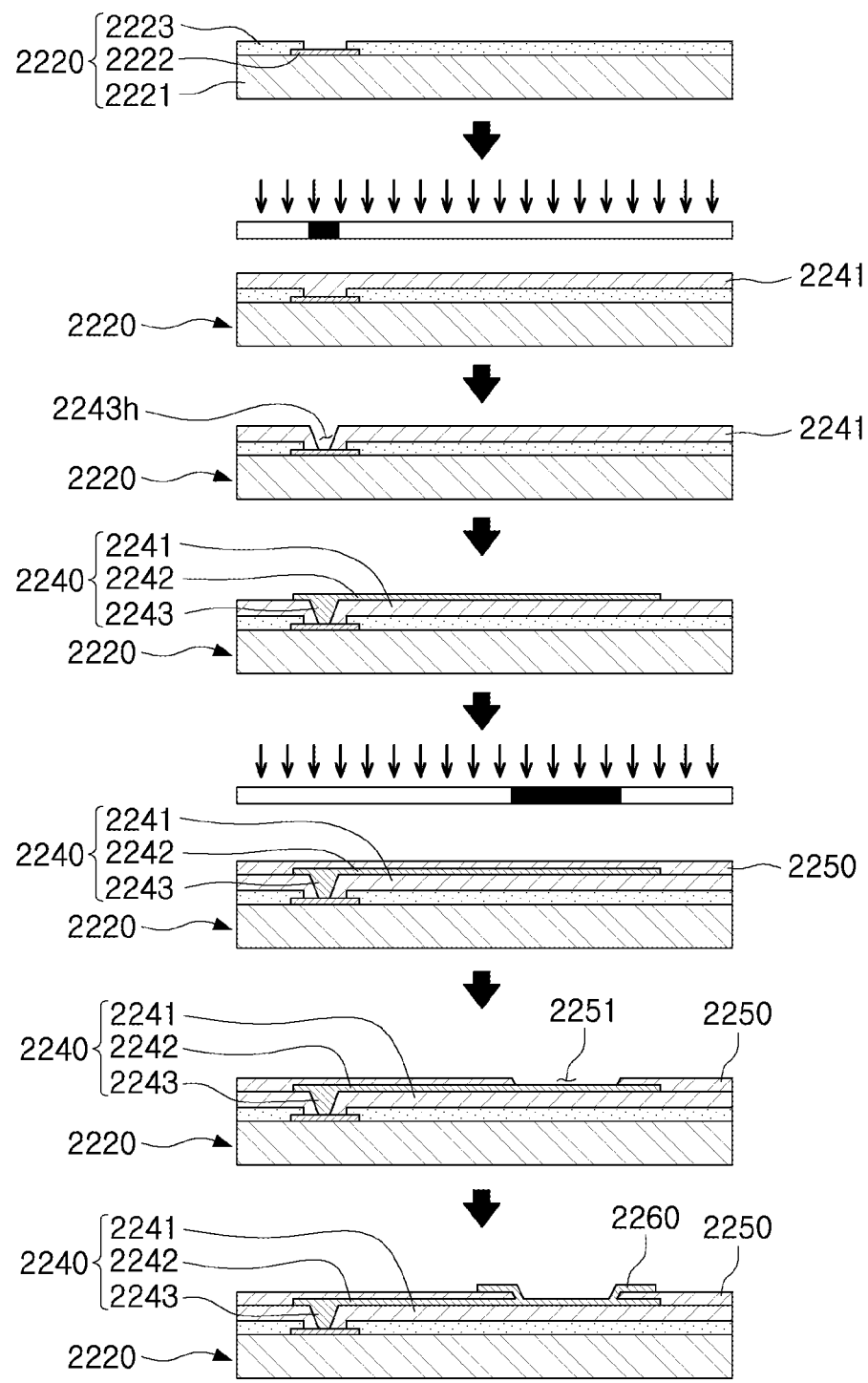
FIG. 4 is a schematic cross-sectional view illustrating a packaging process of a fan-in semiconductor package.

FIGS. 3A and 3B are schematic cross-sectional views illustrating states of a fan-in semiconductor package before and after being packaged, and FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. Since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size. In addition, due to the disadvantage described above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
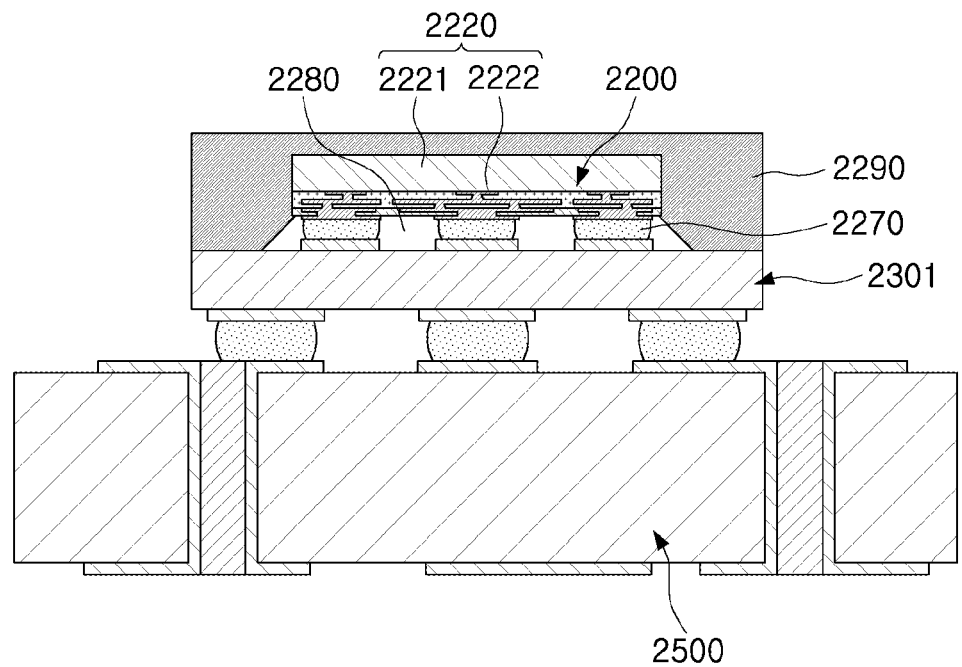
FIG. 5 is a schematic cross-sectional view illustrating a case in which a fan-in semiconductor package is mounted on an interposer substrate and is ultimately mounted on a mainboard of an electronic device.
Figure 6:
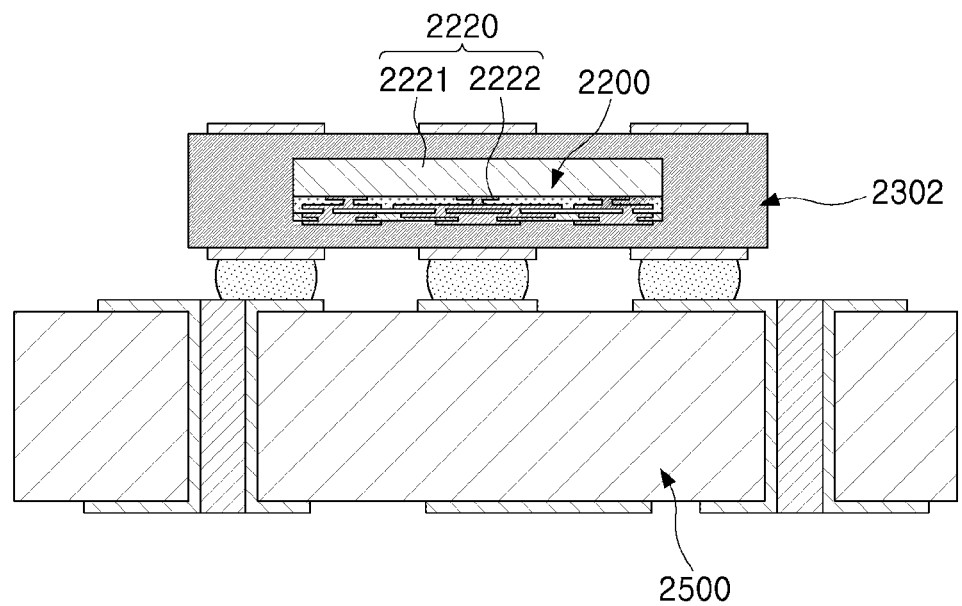
FIG. 6 is a schematic cross-sectional view illustrating a case in which a fan-in semiconductor package is embedded in an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device, and FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, low melting point metal or alloy balls 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-out Semiconductor Package

Figure 7:
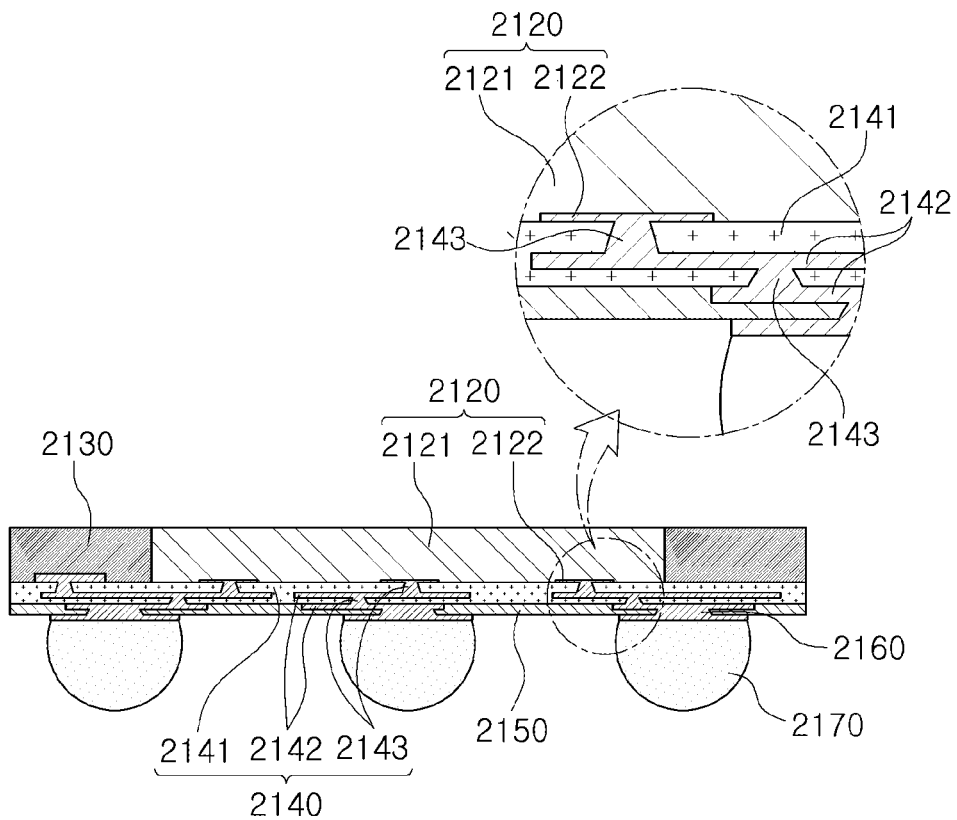
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2150. Low melting point metal or alloy balls 2170 may further be formed on the underbump metal layer 2160. The semiconductor chip 2120 may be an integrated circuit (IC) including a body 2121, the connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection structure 2140 may be formed after the encapsulant 2130 is formed outside the semiconductor chip 2120. In this case, the connection structure 2140 may be formed after the semiconductor chip 2120 is encapsulated, and the vias 2143 connected to the redistribution layers may thus have a width that becomes small as they become close to the semiconductor chip (see an enlarged region).

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in the case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
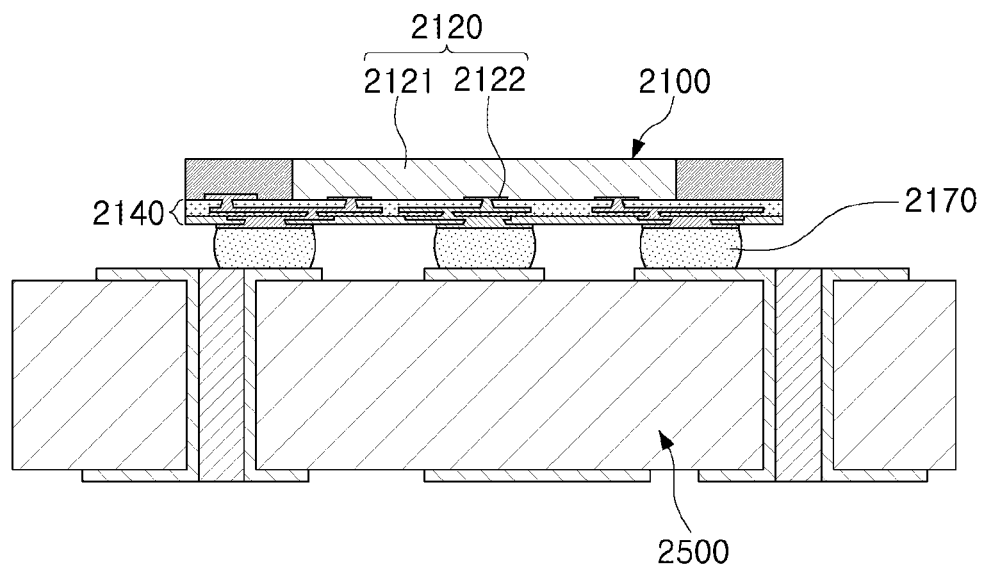
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through low melting point metal or alloy balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
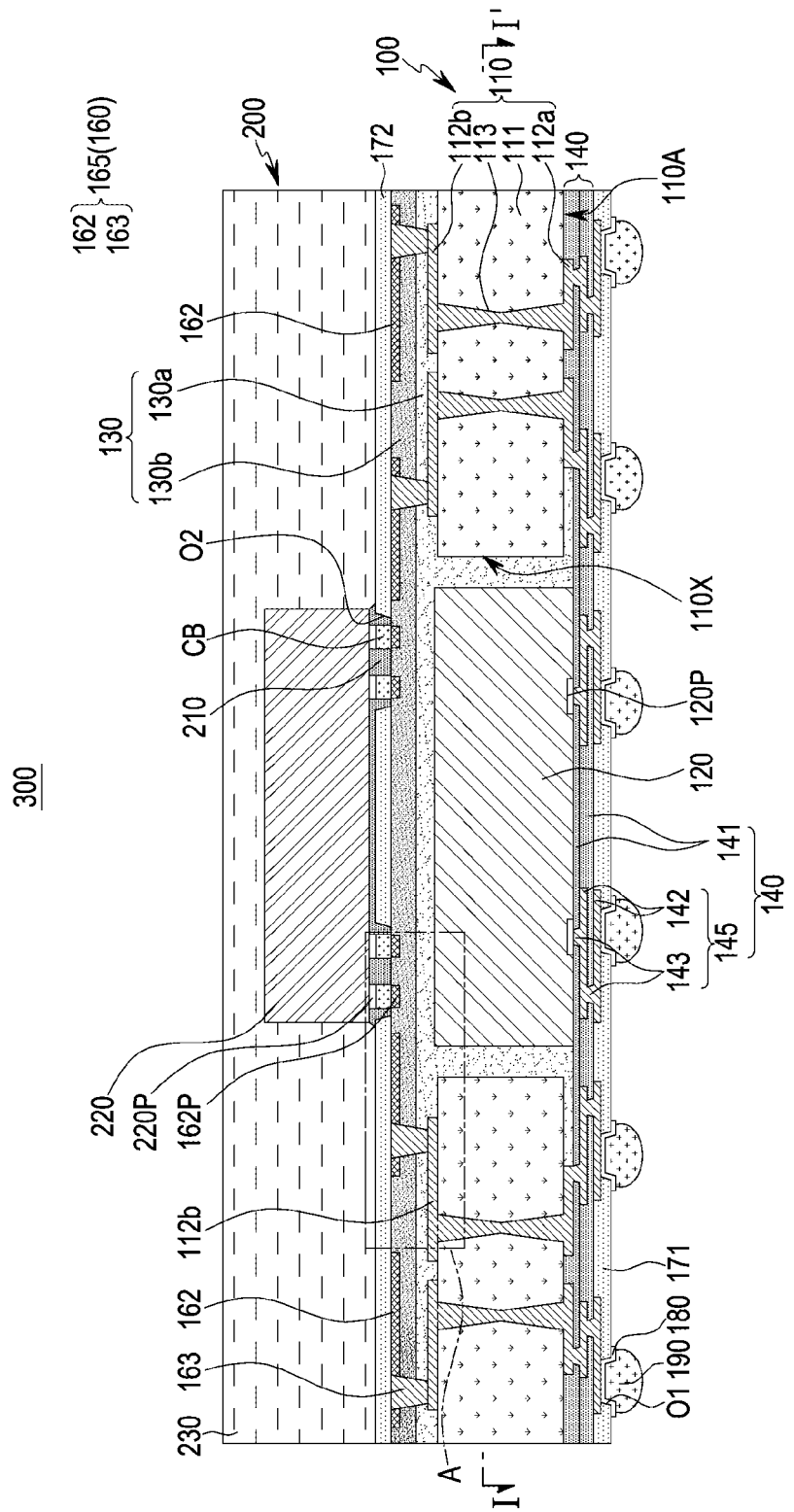
FIG. 9 is a side cross-sectional view illustrating a semiconductor package according to an exemplary embodiment in the present disclosure.
Figure 10:
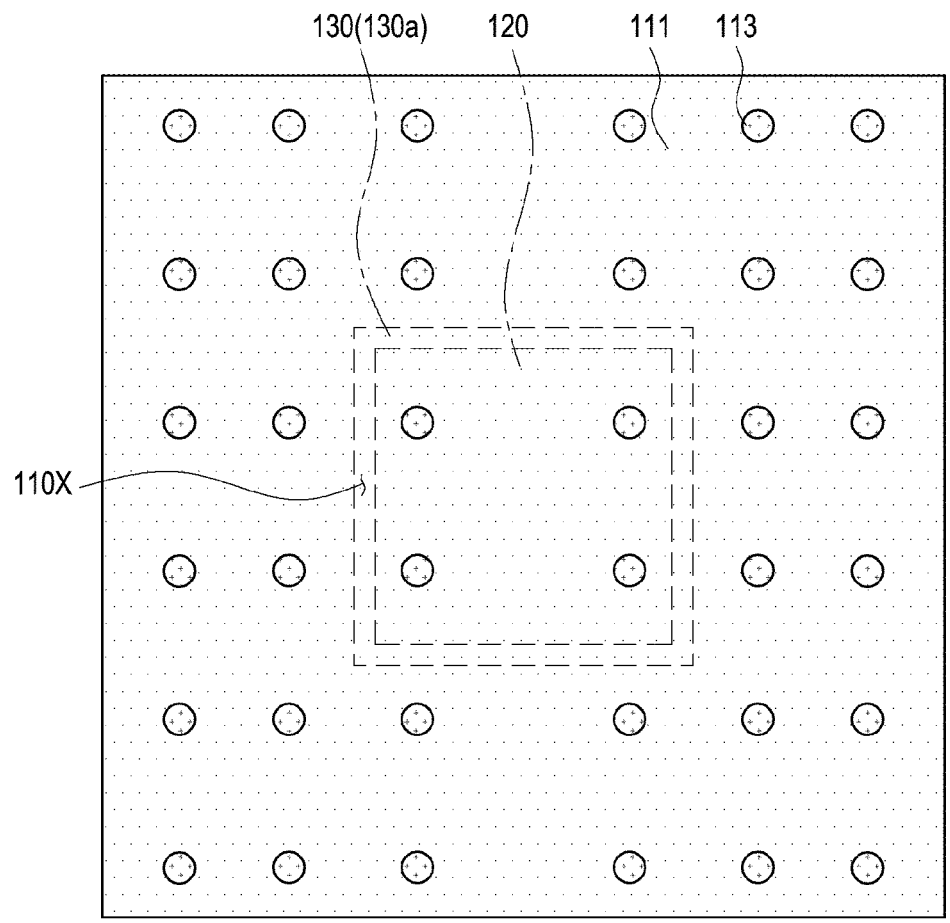
FIG. 10 is a plan view taken along line I-I' of the semiconductor package illustrated in FIG. 9.

FIG. 9 is a side cross-sectional view illustrating a semiconductor package according to an exemplary embodiment in the present disclosure, and FIG. 10 is a plan view taken along line I-I' of the semiconductor package illustrated in FIG. 9.

Referring to FIGS. 9 and 10, a semiconductor package 300 according to the present exemplary embodiment may have a package-on-package (POP) structure including a lower package 100 including a first semiconductor chip 120 and an upper package 200 disposed on the lower package 100 and including a second semiconductor chip 220.

The lower package 100 may include a frame 110 having a cavity 110X and having a first surface 110A and a second surface 110B opposing each other, the first semiconductor chip 120 disposed in the cavity 110X, a first connection structure 140 disposed on the first surface 110A of the frame 110 and beneath the first semiconductor chip 120, and a first encapsulant 130 encapsulating the first semiconductor chip 120 disposed in the cavity 110X and covering the second surface 110B of the frame 110.

The upper package 200 may include a second connection structure 160 disposed on the first encapsulant 130, the second semiconductor chip 220 disposed on the second connection structure 160, and a second encapsulant 230 disposed on the second connection structure 160 and covering the second semiconductor chip 220.

In the lower package 100 of the semiconductor package 300 according to the present exemplary embodiment, the frame 110 may include an insulating member 111 and a wiring structure connecting the first surface 110A and the second surface 110B to each other. In the present exemplary embodiment, the wiring structure may include first and second wiring patterns 112a and 112b disposed on the first and second surfaces 110A and 110B of the frame 110, respectively, and through-vias 113 connecting the first and second wiring patterns 112a and 112b to each other.

The first connection structure 140 may include insulating layers 141 and first redistribution layers 145 formed on the insulating layers 141. The first redistribution layers 145 may include a redistribution pattern 142 disposed on the insulating layers and redistribution vias 143 penetrating through the insulating layers 141 and connected to the redistribution pattern 142. The first redistribution layers 145 may be connected to the wiring structure (particularly, a first wiring pattern 112a) of the frame 110 and connection pads 120P of the first semiconductor chip 120 through the redistribution vias 143. A case in which the first redistribution layers 145 used in the present exemplary embodiment has a two-level structure in which they are disposed on two insulating layers 141, respectively, is exemplified, but the first redistribution layers 145 are not limited thereto, and may have a one-level structure or three-level or more structure.

The second connection structure 160 used in the present exemplary embodiment may include a second redistribution layer 165, which is a backside redistribution layer. Since the second connection structure 160 is formed in a single-level structure without including an insulating layer, the second redistribution layer 165 itself may constitute the second connection structure 160, but in another exemplary embodiment (see FIG. 17), the second connection structure may include a separate insulating layer additionally used and a second redistribution layer having a two-level or more structure.

In the present exemplary embodiment, the second redistribution layer 165 may include a redistribution pattern 162 (hereinafter, referred to as "first redistribution pattern") and connection vias 163. The redistribution pattern 162 may be embedded in the first encapsulant 130 so that one surface thereof is exposed to an upper surface of the first encapsulant 130, and the connection vias 163 may penetrate through the first encapsulant 130 and connect the redistribution pattern 162 to the wiring structure (particularly, the second wiring pattern 112b) of the frame 110. As described above, the redistribution pattern 162 may be connected to the second wiring pattern 112b through the connection vias 163, and may be connected to the first redistribution layer 145 and the first semiconductor chip 120 through the wiring structure of the frame 110.

In the present exemplary embodiment, the first encapsulant 130 may include an encapsulating insulating layer 130a encapsulating the first semiconductor chip 120 and covering the second surface 110B of the frame 110 and a bonding insulating layer 130b disposed on the encapsulating insulating layer 130a and embedding the redistribution pattern 162 therein so that the one surface of the redistribution pattern 162 is exposed.

The bonding insulating layer 130b may provide a B-stage base for laminating the redistribution pattern 162 even after the encapsulating insulating layer 130a is hardened. In addition, the bonding insulating layer 130b may be introduced as a layer for improving flatness so that a lamination process is precisely implemented. For example, the bonding insulating layer 130b may include an insulating material such as an Ajinomoto Build-up Film (ABF). In some exemplary embodiments, the encapsulating insulating layer 130a may be formed of the same insulating material as that of the bonding insulating layer 130b. Even though the encapsulating insulating layer 130a and the bonding insulating layer 130b are formed of the same material, hardening points in times of the encapsulating insulating layer 130a and the bonding insulating layer 130b are different from each other, and an interface between the encapsulating insulating layer 130a and the bonding insulating layer 130b may thus be observed. In another exemplary embodiment, the encapsulating insulating layer 130a and the bonding insulating layer 130b may be formed of different materials.

As illustrated in FIG. 9, a second passivation layer 172 may be formed on a surface of the first encapsulant 130 on which the second redistribution layer 165 is formed. The second passivation layer 172 may have second openings O2 opening pad regions 162P of the second redistribution pattern 162. The second semiconductor chip disposed on the second connection structure may be disposed on a level above the second openings O2. Connection pads 220P of the second semiconductor chip 220 may be connected to the pad regions 162P, respectively, by bumps CB formed of copper. An underfill material 210 may be filled between the second semiconductor chip 220 and the second connection structure 160. The second semiconductor chip 220 may be connected to the second redistribution layer 165 through the pad regions 162P, and may also be electrically connected to the first semiconductor chip 120 through the wiring structure and the first redistribution layers 145.

The second redistribution layer 165 used in the present exemplary embodiment may be implemented in a form in which it is embedded in the first encapsulant 130, particularly, the bonding insulating layer 130b, as described above, and a structure of the second redistribution layer 165 will be described in detail with reference to FIGS. 11A and 11B.

Figure 11A:
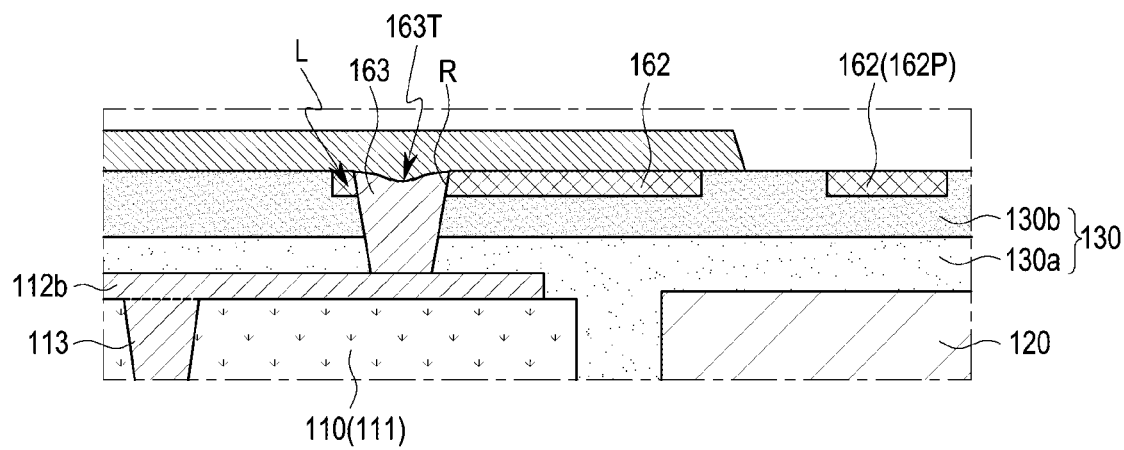
FIGS. 11A and 11B are, respectively, an enlarged side cross-sectional view and a plan view illustrating a partial region (portion A) of the semiconductor package illustrated in FIG. 9.
Figure 11B:
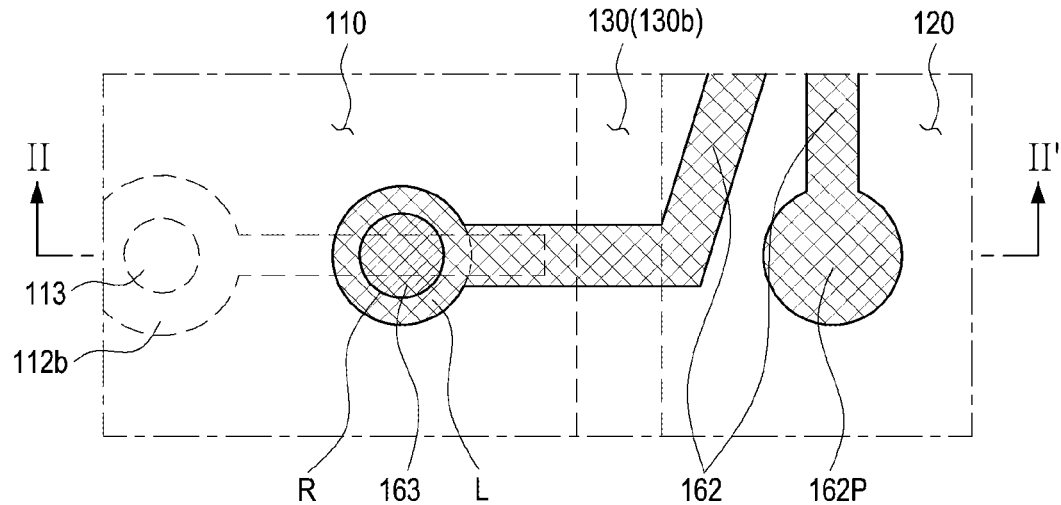

FIGS. 11A and 11B are, respectively, an enlarged cross-sectional view and a partial plan view illustrating region A of the semiconductor package 300 illustrated in FIG. 9. FIG. 11A is a side cross-sectional view taken along line II-II' of FIG. 11B.

Referring to FIGS. 11A and 11B, the redistribution pattern 162 may be embedded in the first encapsulant 130 (particularly, the bonding insulating layer 130b) so that the one surface thereof is exposed, and the exposed surface of the redistribution pattern 162 may be substantially coplanar with the surface of the first encapsulant 130, but is not limited thereto. For example, the exposed surface of the redistribution pattern 162 may be disposed on a level slightly higher or slightly lower than that of the surface of the first encapsulant 130.

The connection vias 163 may be provided as vertical paths connecting the redistribution pattern 162 and the second wiring pattern 112b of the wiring structure to each other. As illustrated in FIG. 11B, the redistribution pattern 162 may have a land L in which an opening R having a ring shape is formed. The opening is not limited to having the ring shape, and may have various other shapes or a similar ring shape of which a portion is opened rather than a closed ring shape. The connection via 163 may be provided after the redistribution pattern 162 is laminated. In detail, the connection via 163 may be formed by filling a hole connected to the second wiring pattern 112b through the opening R of the land of the redistribution pattern by a plating process (see FIGS. 15A and 15B). Since the connection via 163 used in the present exemplary embodiment is formed by a process (a plating process) different from a process of forming the redistribution pattern 162, an interface such as a grain boundary may be observed between the connection via 163 and the redistribution pattern 162.

A width of a region of the connection via 163 in contact with the redistribution pattern 162 may be greater than that of a region of the connection via 163 in contact with the wiring structure. An upper surface 163T of the connection via 163 may have a recessed region at a central portion thereof. In the present exemplary embodiment, other redistribution patterns 162 and other connection vias 163 constituting the second redistribution layer 165 may also have a structure similar to the structure described above. In some exemplary embodiments, an upper surface of the connection via 163 may be substantially coplanar with a surface of the redistribution pattern 162 by plating and planarizing processes for the connection via 163.

Figure 12:
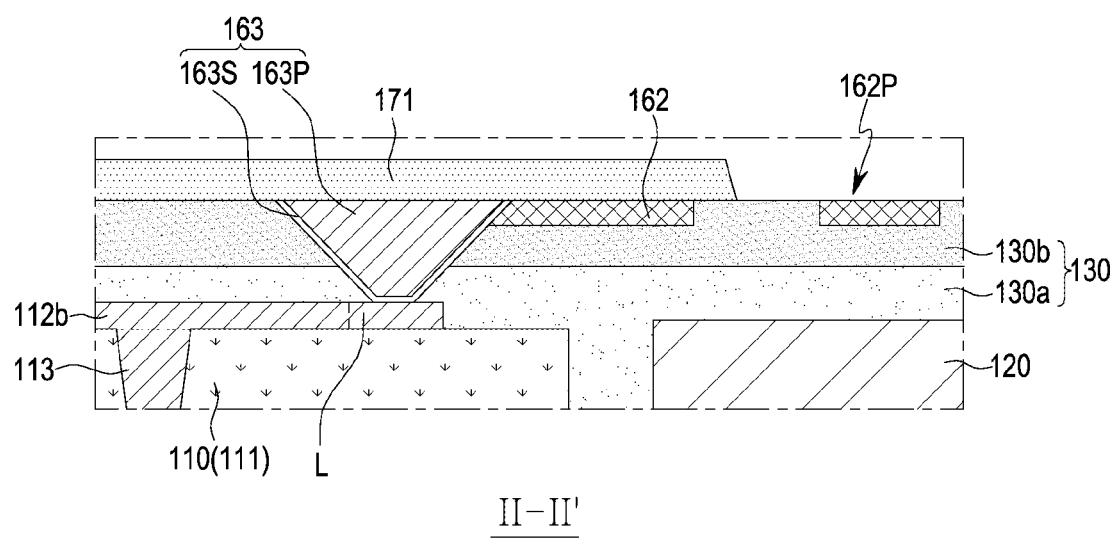
FIG. 12 is an enlarged side cross-sectional view illustrating a partial region of a semiconductor package according to an exemplary embodiment in the present disclosure.

The connection via 163 is not limited to the exemplary embodiment described above in which the opening R having the ring shape is used, and may be connected to one end of the redistribution pattern. As illustrated in FIG. 12, the connection via 163 may be connected to one end of the redistribution pattern 162 while being connected to the second wiring pattern 112b of the wiring structure. The connection via 163 may include a seed layer 163S disposed on an interface with the first encapsulant 130 and a plating layer 163P formed on the seed layer 163S, and the seed layer 163S may be disposed on a surface of the connection via 163 including an interface of the redistribution pattern 162. The connection via 163 illustrated in FIG. 11A may also be formed by a plating process, and may thus have a structure including a seed layer and a plating layer as in the present exemplary embodiment.

Figure 16A:
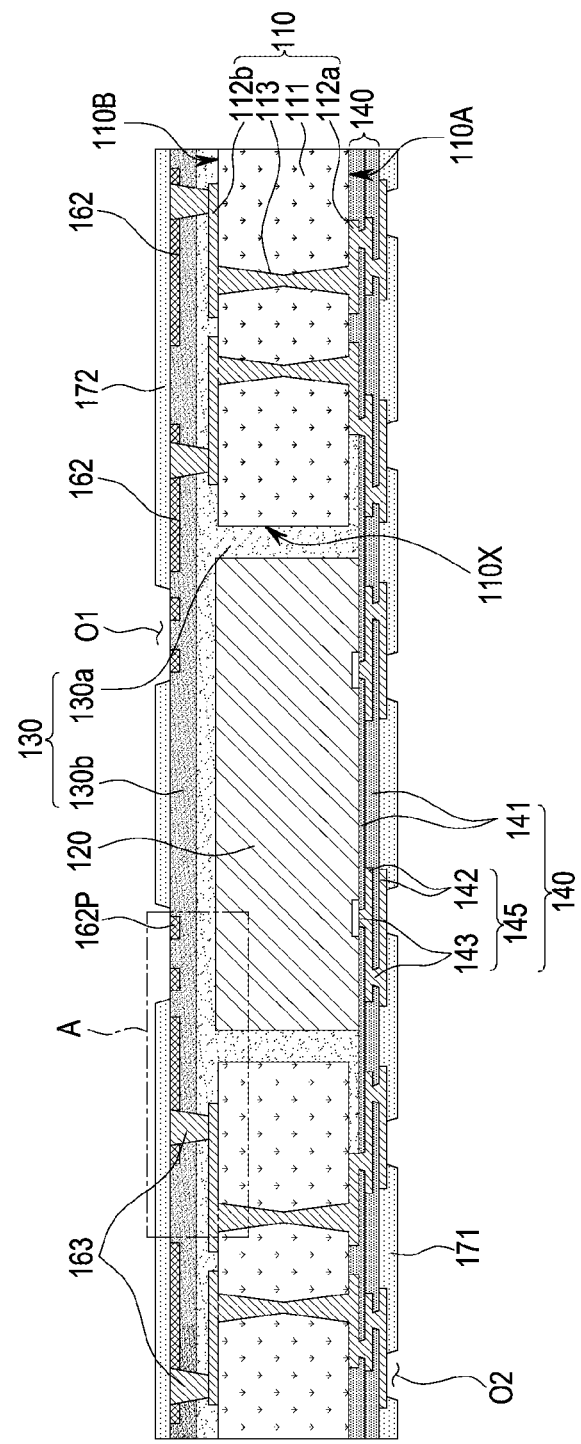
FIGS. 16A through 16C are cross-sectional views for describing main processes (a process of mounting a second semiconductor chip) of the method of manufacturing the semiconductor package illustrated in FIG. 9.
Figure 16B:
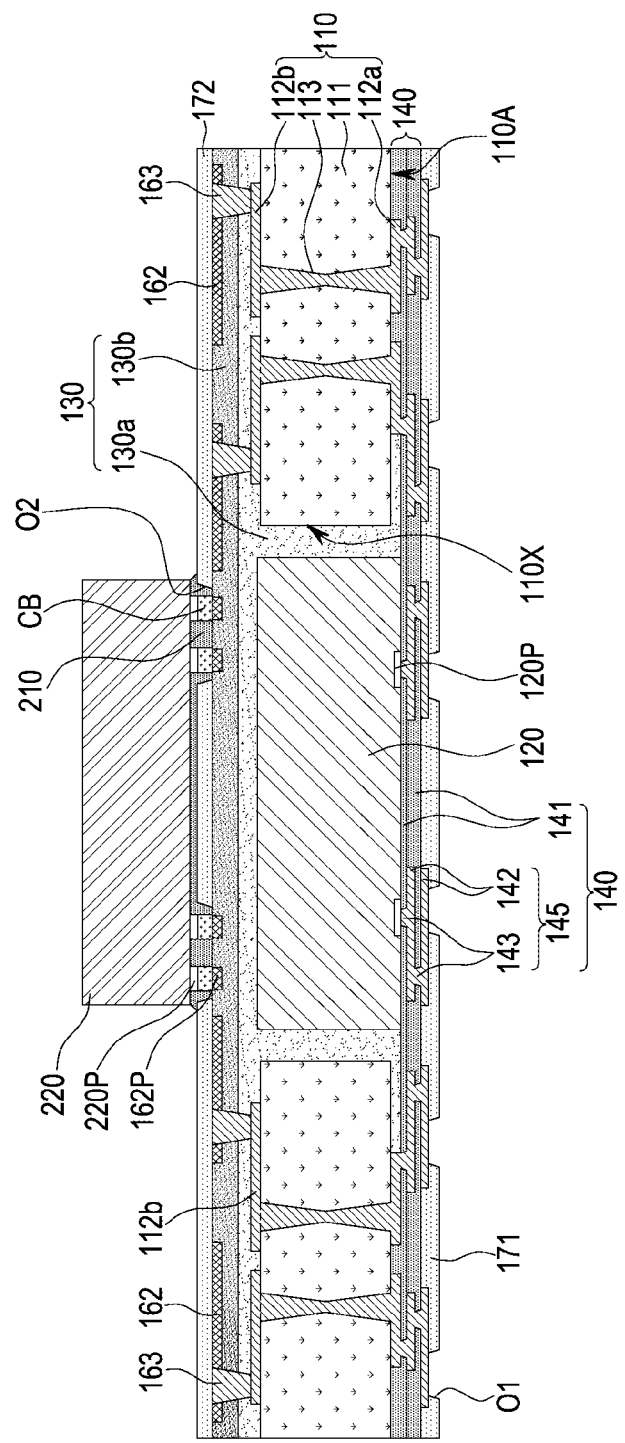
Figure 16C:
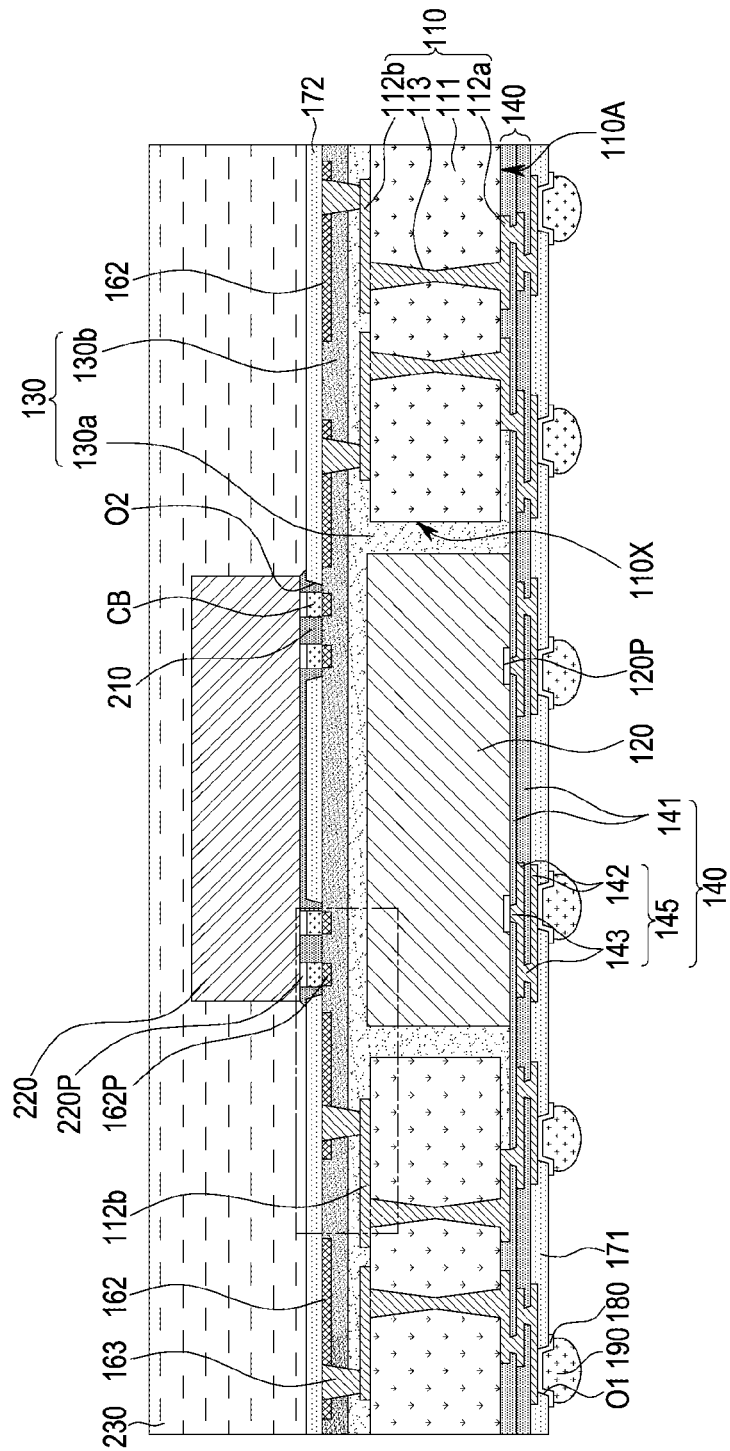

According to the present exemplary embodiment, in the lower package 100, the first semiconductor chip 120 may be mounted before the first connection structure 140 is formed, while in the upper package 200, the second semiconductor chip 220 may be mounted after the second connection structure 160 is formed (see FIGS. 16A through 16C).

In addition, the lower and upper packages 100 and 200 are not coupled to each other in a soldering manner according to the related art, but may be coupled to each other by flip-chip-bonding the connection pads 220P of the second semiconductor chip 220, such that a bonding gap may be reduced and transmission loss of signals and powers may be reduced. Further, the second redistribution layer 165 or the redistribution pattern 162 may be manufactured in advance by a thin film process (sputtering or PID insulating layer) before a lamination process, and may thus be formed at a finer pitch.

The respective components included in the semiconductor package 300 according to the present exemplary embodiment will hereinafter be described in more detail.

The frame 110 may maintain rigidity of the semiconductor package 300. The first semiconductor chip 120 may be disposed in the cavity 110X of the frame 110, and may be fixed by the first encapsulant 130. The frame 110 may provide an extending routing region to the semiconductor package 300, and improve a degree of freedom in a design of the semiconductor package 300. The wiring structure of the frame 110 used in the present exemplary embodiment is only an example, and may be variously modified. For example, the wiring structure may further include one or more patterns disposed on an intermediate level of the frame 110. These patterns may include, for example, ground (GND) patterns, power (PWR) patterns, and signal patterns, in addition to redistribution patterns. Such a wiring structure may be formed before the first semiconductor chip 120 is disposed, resulting in suppression of a decrease in a yield due to the first semiconductor chip 120.

The insulating member 111 of the frame 110 may include a thermosetting resin such as an epoxy resin, a thermoplastic resin such as a polyimide resin, or a resin in which a reinforcement material such as a glass fiber and/or an inorganic filler is impregnated, for example, prepreg, ABF, FR-4, Bismaleimide Triazine (BT), or the like. Alternatively, a photosensitive insulating material such as a photoimagable dielectric (PID) resin may be used as a material of the insulating member 111. As another example, a metal having excellent rigidity and thermal conductivity may be used. In this case, an Fe—Ni based alloy may be used as the metal. In this case, a Cu plating layer may also be formed on a surface of the Fe—Ni based alloy in order to secure adhesion between the Fe—Ni based alloy and the first encapsulant 130, another interlayer insulating material, and the like. The insulating member 111 is not limited thereto, but may also be formed of glass, ceramic, plastic, or the like. Meanwhile, the wiring structure may include a conductive material such as copper (Cu), aluminum (Al), silver (Ag), tin (Sn), gold (Au), nickel (Ni), lead (Pb), or alloys thereof, but is not limited thereto.

The first connection structure 140 may be configured to basically redistribute the connection pads 120P of the first semiconductor chip 120. Several tens to several hundreds of connection pads 120P having various functions may be redistributed by the first connection structure 140, and may be physically and/or electrically connected to an external apparatus through electrical connection metals 190. The first connection structure 140 may be connected to the connection pads 120P of the first semiconductor chip 120, and may support the first semiconductor chip 120. The first connection structure 140 may be directly connected to the first semiconductor chip 120 and be electrically connected to the wiring structure of the frame 110 and the second redistribution layer 165, the second semiconductor chip 220 may be connected to the second redistribution layer 165, and the first semiconductor chip 120 and the second semiconductor chip 220 may be electrically connected to each other in a bypass manner through the first redistribution layers 145, the second redistribution layer 165, and the wiring structure.

As described above, the first connection structure 140 may include the insulating layers 141 and the first redistribution layers 145 formed on the insulating layers 141, and the insulating layers 141 may include a thermosetting resin such as an epoxy resin, a thermoplastic resin such as a polyimide resin, or a resin in which the thermosetting resin and the thermoplastic resin are impregnated in a reinforcement material such as an inorganic filler, similar to the insulating member described above. A photosensitive insulating material such as a PID resin may be used as a material of each of the insulating layers 141. When the insulating layer is introduced into the second connection structure 160 and two or more second redistribution layers 165 are formed in the second connection structure 160 as described above, the insulating layer of the second connection structure 160 may also be formed of a material that is the same as or similar to that of the insulating layer 141 of the first connection structure 140.

The first and second redistribution layers 145 and 165 may include, for example, a conductive material such as copper (Cu), aluminum (Al), silver (Ag), tin (Sn), gold (Au), nickel (Ni), lead (Pb), or alloys thereof. A surface treatment layer may further be formed on exposed pad regions 162P of the second redistribution pattern 162, if necessary.

The first encapsulant 130 may be configured to protect and the first semiconductor chip 120. In the present exemplary embodiment, the first encapsulant 130 may encapsulate the second surface 110B of the frame 110 as well as the first semiconductor chip 120. An encapsulation form of the first encapsulant 130 is not particularly limited, but may be a form in which the first encapsulant 130 surrounds the first semiconductor chip 120. For example, the first encapsulant 130 may cover the first semiconductor chip 120, and may fill the remaining space within the cavity 110X of the frame 110. The first encapsulant 130 may fill the cavity 110X to thus serve as an adhesive and reduce buckling of the first semiconductor chip 120. The first encapsulant 130 may cover all surfaces of the first semiconductor chip 120 except for a lower surface of the first semiconductor chip 120. The first encapsulant 130 may cover only portions of the lower surface of the first semiconductor chip 120 depending on positions and shapes of the connection pads 120P of the first semiconductor chip 120. In some exemplary embodiments, the first encapsulant 130 may include a plurality of layers formed of a plurality of materials. In detail, in the present exemplary embodiment, the first encapsulant 130 may include the encapsulating insulating layer 130a encapsulating the first semiconductor chip 120 and covering the second surface 110B of the frame 110 and the bonding insulating layer 130b disposed on the encapsulating insulating layer 130a and embedding the redistribution pattern 162 therein so that the one surface of the redistribution pattern 162 is exposed. The bonding insulating layer 130b may provide the B-stage base for laminating the redistribution pattern 162. In some exemplary embodiments, the encapsulating insulating layer 130a may be formed of the same insulating material as that of the bonding insulating layer 130b. In another exemplary embodiment, the encapsulating insulating layer 130a and the bonding insulating layer 130b may be formed of different materials.

A material of the first encapsulant 130 is not particularly limited, but may be thermosetting resin such as an epoxy resin, a thermoplastic resin such as a polyimide resin, a resin in which a thermosetting resin or a thermoplastic resin is impregnated in a reinforcement material such as a glass fiber and/or an inorganic filler, for example, prepreg, ABF, or the like. In addition, any known molding material such as an epoxy molding compound (EMC), or the like, may be used. In some exemplary embodiments, a material including a glass fiber and/or an inorganic filler and an insulating resin may be used as a material of the first encapsulant 130 to effectively suppress warpage of the semiconductor package.

In some exemplary embodiments, the first encapsulant 130 may include conductive particles in order to block electromagnetic waves. For example, the conductive particles may include copper (Cu), aluminum (Al), silver (Ag), tin (Sn), gold (Au), nickel (Ni), lead (Pb), solder, or the like, but are not limited thereto.

The second encapsulant 230 may be disposed on the second passivation layer 172 and may encapsulate the second semiconductor chip 220. The second encapsulant 230 may include a material that is the same as or similar to the insulating material of the first encapsulant 130.

The semiconductor package 300 according to the present exemplary embodiment may further include a first passivation layer 171 disposed beneath the first connection structure 140, similar to the second passivation layer 172 disposed on the first encapsulant 130 on which the second redistribution layer 165 is formed.

The first and second passivation layers 171 and 172 may be configured to protect the second redistribution layer 165 and the first connection structure 140, respectively, from external physical or chemical damage, or the like. The first passivation layer 171 may have first openings O1 exposing at least portions of the wiring pattern 142 of the first connection structure 140, similar to the second passivation layer 172 described above. A material of each of the first and second passivation layers 171 and 172 is not particularly limited, and may be, for example, a solder resist. In some exemplary embodiments, a material (for example, a PID resin, an ABF, or the like) that is the same as or similar to the insulating material used for the frame 110 and/or the first connection structure 140 may be used as the material of each of the first and second passivation layers 171 and 172.

The semiconductor package 300 according to the present exemplary embodiment may further include the electrical connection metals 190 disposed in the first openings O1 of the first passivation layer 171 and externally exposed. The electrical connection metals 190 may be configured to physically and/or electrically externally connect the semiconductor package 300. For example, the semiconductor package 300 may be mounted on the motherboard of the electronic device through the electrical connection metals 190. The electrical connection metals 190 may be connected the redistribution pattern 142 exposed by the first openings O1. In some exemplary embodiment, additional underbump metal (UBM) layers 180 may be formed on the redistribution pattern 142, and the electrical connection metals 190 may be formed.

For example, each of the electrical connection metals 190 may be formed of a low melting point metal such as tin (Sn) or alloys including tin (Sn). The electrical connection metals 190 may have various structures such as a land, a ball, a pin, or the like, but are not limited thereto.

Some of the electrical connection metals 190 may be disposed in a fan-out region. A fan-out package may have excellent reliability as compared to a fan-in package, may implement a plurality of input/output (I/O) terminals, and may facilitate a 3D interconnection. An array (the number, an interval, or the like) of the electrical connection metals 190 is not particularly limited, but may be variously modified depending on a condition of an external apparatus on which the semiconductor package is to be mounted. A case in which the electrical connection metals 190 are provided on only a lower surface of the first connection structure 140 is illustrated in the present exemplary embodiment, but in some exemplary embodiments, external connection terminals similar to the electrical connection metals 190 may also be provided on the pad regions 162P of the second redistribution layer 165.

FIGS. 13A through 13F are cross-sectional views for describing main processes of a method of manufacturing the semiconductor package illustrated in FIG. 9. Contents overlapping those described above in a description for a method of manufacturing the semiconductor package 300 are hereinafter omitted or briefly described.

Figure 13A:
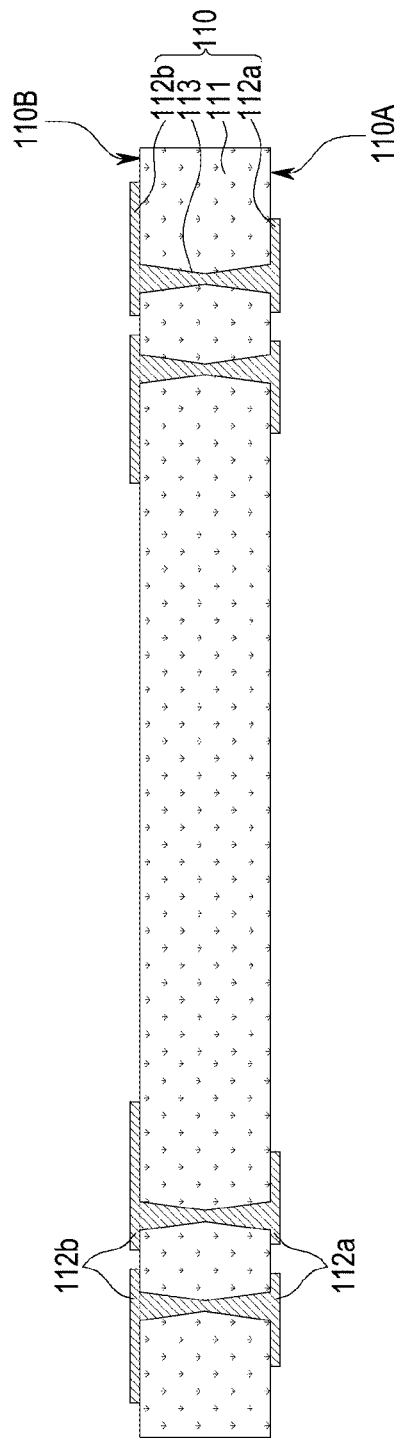
FIGS. 13A through 13F are cross-sectional views for describing main processes (a process of forming a wiring layer and a lamination process) of a method of manufacturing the semiconductor package illustrated in FIG. 9.

Referring to FIG. 13A, the frame 110 may be prepared by forming the wiring structure in and on the insulating member 111.

The insulating member 111 may be a copper clad laminate (CCL) having thin metal layers, for example, copper foils (not illustrated), formed on upper and lower surfaces thereof. The copper foils may be used as seed layers for forming patterns. The first and second wiring patterns 112a and 112b and the through-via 113 connecting the first and second wiring patterns 112a and 112b to each other may be formed on and in the insulating member 111. Holes for the through-vias 113 may be formed using a mechanical drill and/or a laser drill (for example, a $CO_2$ laser drill or an yttrium aluminum garnet (YAG) laser drill). A desmear process may be performed to remove a resin smear in the holes (not illustrated). The through-vias 113 and the first and second wiring patterns 112a and 112b may be formed by electrolytic copper plating, electroless copper plating, or the like, using a dry film pattern. In more detail, the through-vias 113 and the first and second wiring patterns 112a and 112b may be formed by a method such as a subtractive process, an additive process, a semi-additive process (SAP), a modified semi-additive process (MSAP), or the like, but are not limited thereto. That is, the through-vias 133 and the first and second wiring patterns 112a and 112b may also be formed by a method such as chemical vapor deposition (CVD), physical vapor deposition (PVD), or sputtering, if necessary.

Figure 13B:
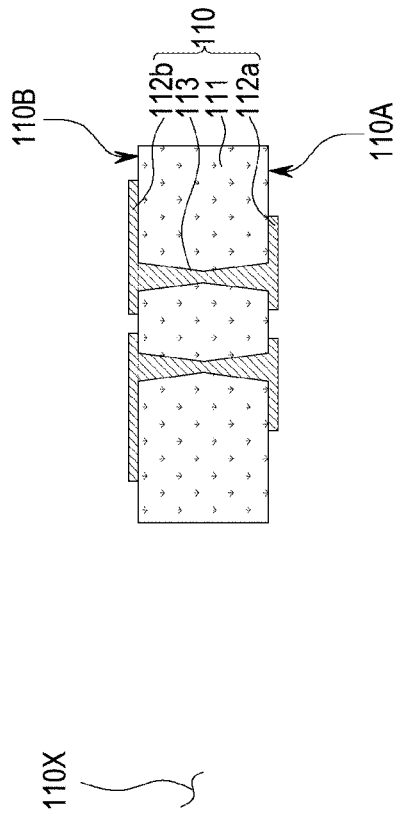
Figure 13B:
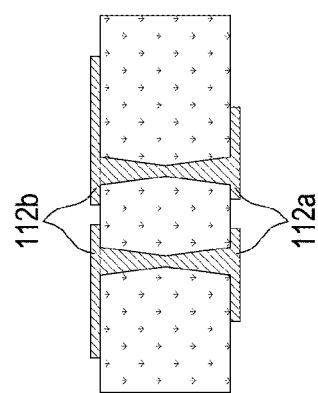

Then, referring to FIG. 13B, the cavity 110X penetrating through the first surface 110A and the second surface 110B of the frame 110 may be formed.

A method of forming the cavity 110X is also not particularly limited. The cavity 110X may be formed by, for example, a mechanical drill and/or a laser drill, a sand blast method using particles for polishing, a dry etching method using plasma, or the like. When the cavity 110X is formed using the mechanical drill and/or the laser drill, a desmear process may be performed to remove a resin smear in the cavity 110X. A size and a shape of the cavity 110X may be designed depending on sizes, shapes, the number, and the like, of first semiconductor chips 120 (see FIG. 13C) that are to be mounted in the cavity 110X.

Figure 13C:
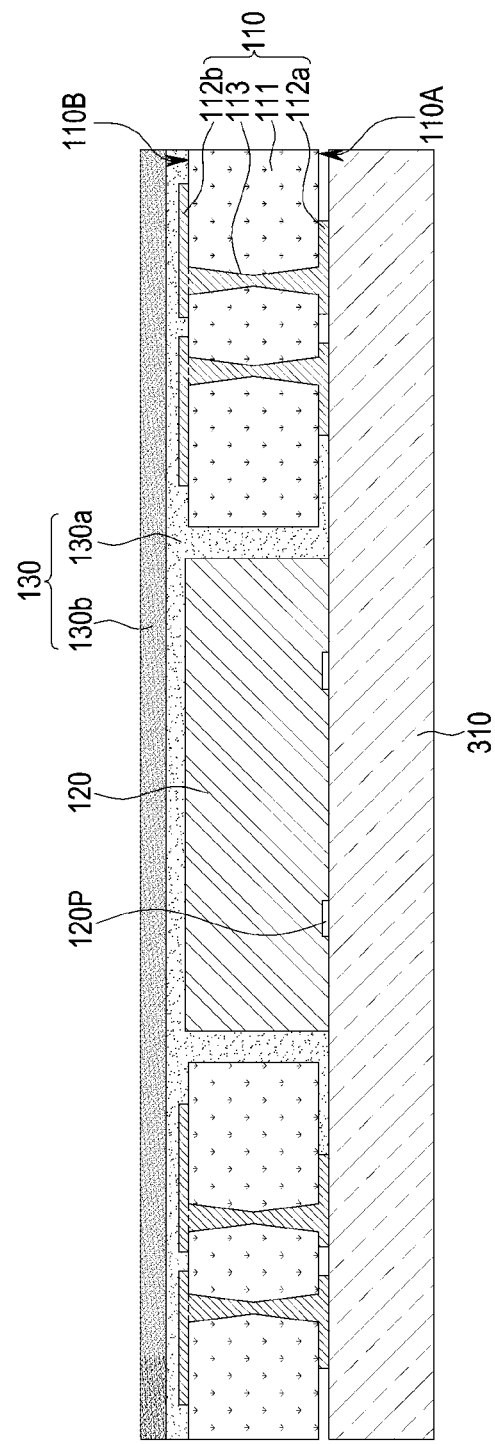

Then, referring to FIG. 13C, an adhesive support 310 may be attached to the second surface 110B of the frame 110, the first semiconductor chip 120 may be disposed in the cavity 110X, and the first encapsulant 130 for encapsulating the first semiconductor chip 120 may then be formed.

The adhesive support 310 may be various support members having an adhesive surface that may fix the frame 110. For example, various types of adhesive tapes such as a thermosetting adhesive tape of which adhesion is weakened by heat treatment, an ultraviolet-curable adhesive tape of which adhesion is weakened by ultraviolet ray irradiation, and the like, may be used as the adhesive support 310.

The first semiconductor chip 120 may be attached to and disposed on the adhesive support 310 in the cavity 110X. The connection pads 120P of the first semiconductor chip 120 may be attached to the adhesive support 310 (face-down). When the connection pads 120P of the first semiconductor chip 120 have an embedded form, the second surface 110B of the frame 110 and the lower surface of the first semiconductor chip 120 may be substantially coplanar with each other. To the contrary, when the connection pads 120P of the first semiconductor chip 120 have a protruding form, the second surface 110B of the frame 110 and lower surfaces of the connection pads 120P may be substantially coplanar with each other.

The first encapsulant 130 may cover the frame 110 and the first semiconductor chip 120 and may fill the space within the cavity 110X. The first encapsulant 130 may be formed by any known method. As an applying method, for example, a screen printing method of applying ink with a squeegee, a spray printing method of applying ink in a mist form, or the like, may be used. In some exemplary embodiments, the first encapsulant 130 may be formed by laminating and then hardening a precursor of the first encapsulant 130.

In the present exemplary embodiment, the first encapsulant 130 may include the encapsulating insulating layer 130a encapsulating the first semiconductor chip 120 and the bonding insulating layer 130b disposed on the encapsulating insulating layer 130a. The bonding insulating layer 130b may provide a B-stage base for laminating the redistribution pattern 162 even after the encapsulating insulating layer 130a is hardened. For example, the bonding insulating layer 130b may include an insulating material such as an ABF.

Figure 13D:
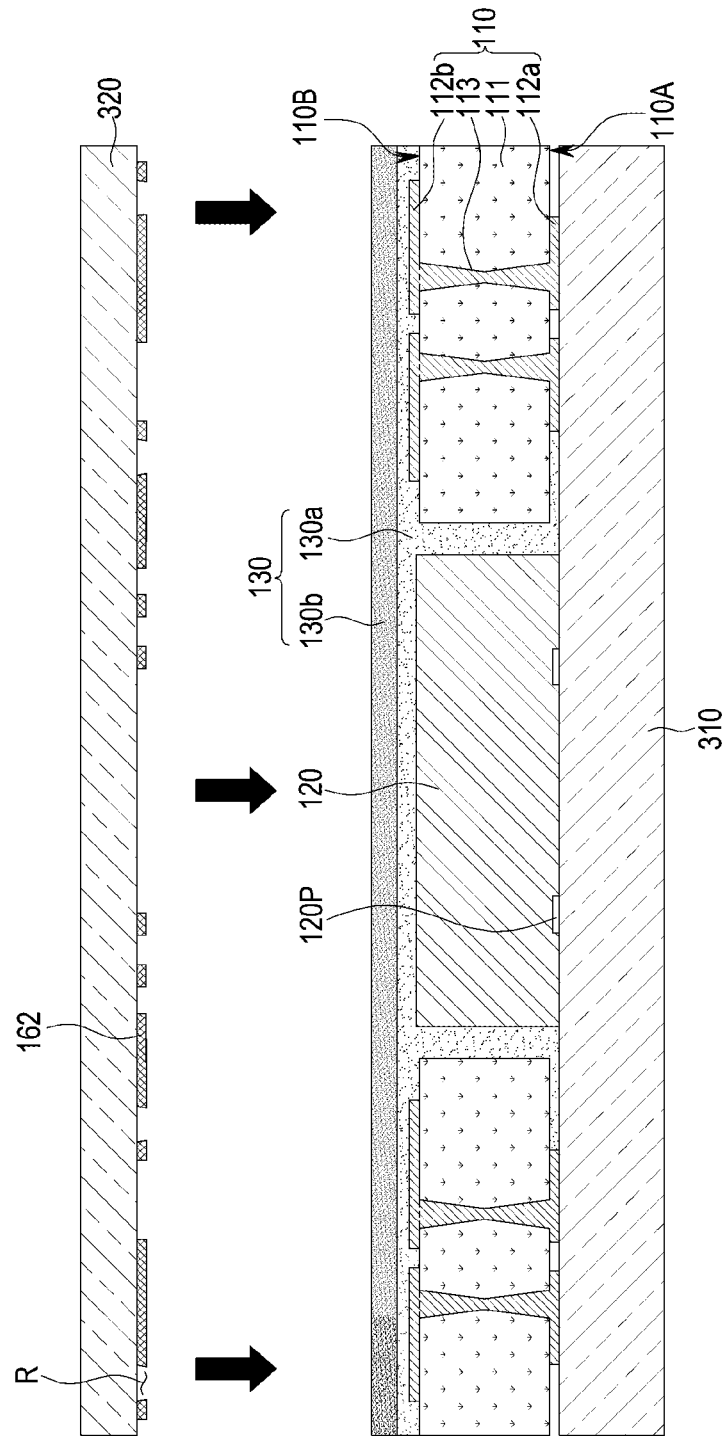
Figure 13E:
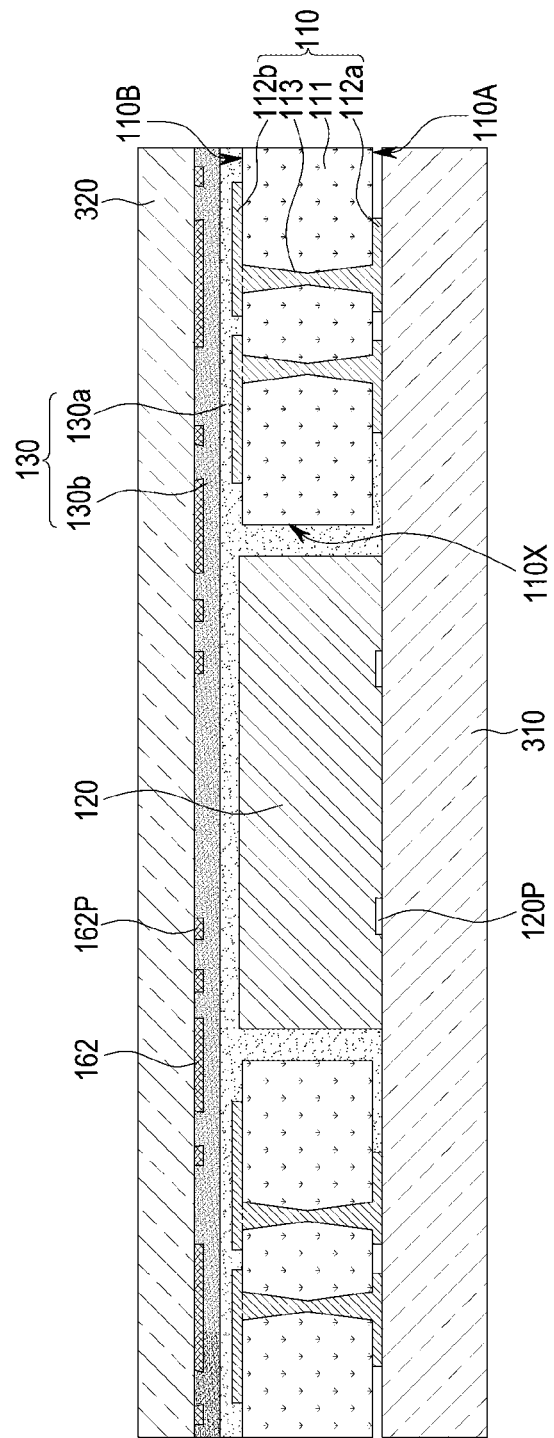

However, in another exemplary embodiment, before a material for forming the first encapsulant 130 is completely hardened (for example, B-stage) after it is applied, a redistribution pattern 162 provided beneath a temporary support 320 may be transferred to be embedded in the surface of the first encapsulant 130 (see FIGS. 13D and 13E).

Referring to FIG. 13D, the redistribution pattern 162 provided beneath the temporary support 320 may be laminated on the surface, that is, the bonding insulating layer 130b, of the first encapsulant 130 that is not hardened or is in the B-stage.

The redistribution pattern 162 having a fine pitch may be formed beneath the temporary support 320 using a thin film process (for example, a sputtering process), but is not limited thereto. In another exemplary embodiment, the redistribution pattern 162 may be formed by a plating process using a seed layer. In some exemplary embodiments, when redistribution layers having a two-level or more structure are formed (see FIG. 17), an insulating layer such as a PID may be introduced to form a fine pattern by a photolithography process. Such a fine pattern may provide fine pad regions corresponding to the connection pads of the second semiconductor chip.

Figure 14:
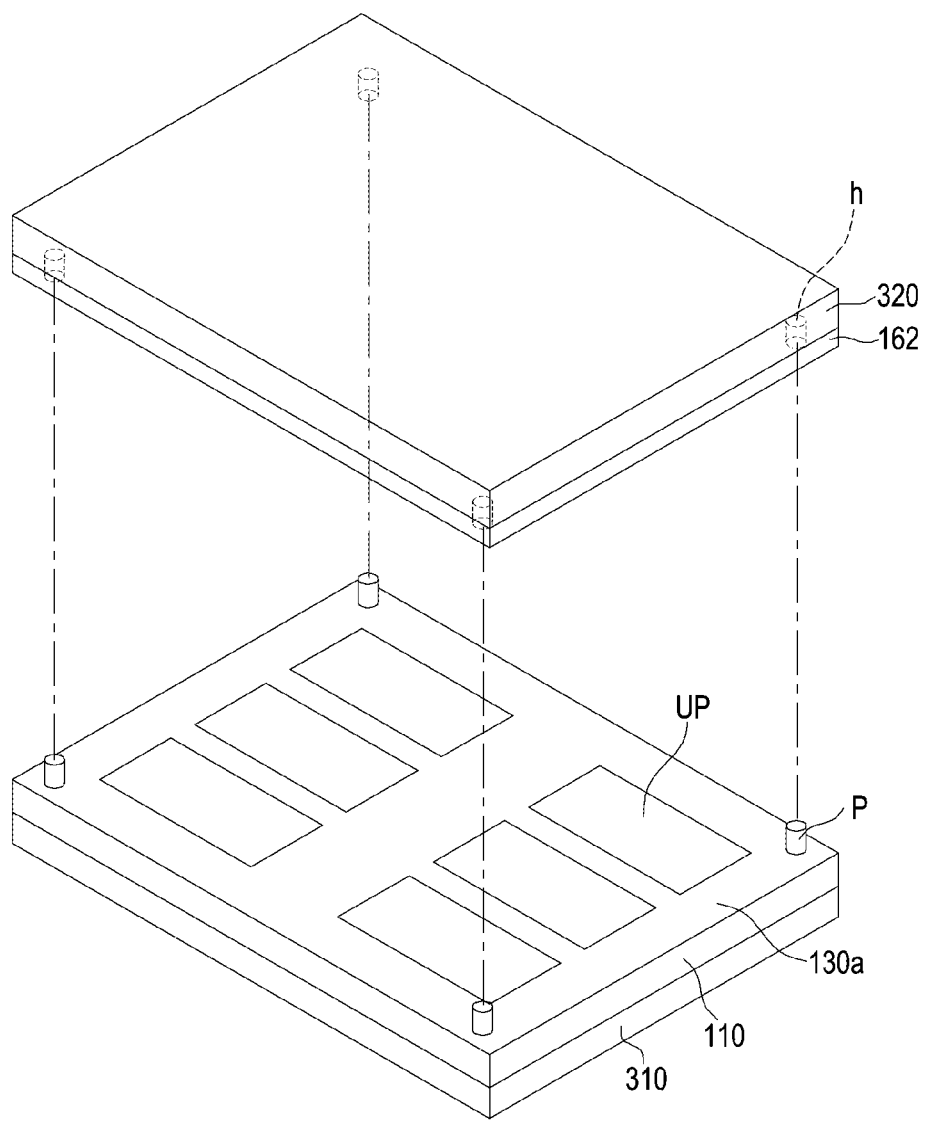
FIG. 14 is a schematic view illustrating a process of FIG. 13D on a panel level.

In the present process, as illustrated in FIG. 14, an intermediate product of a panel level may be formed in a rivet-pin matching manner without using a separate matching equipment. A panel may include a plurality of (for example, six) unit packages (UPs) For example, the adhesive support 310 and the temporary support 320 may be fixed by rivet pins P and holes h accommodating the rivet pins P therein to accurately align the redistribution pattern 162 at a desired position. Even though the alignment is performed using the rivet pins as described above, an inevitable matching error may occur.

Then, referring to FIG. 13E, the redistribution pattern 162 may be embedded in the surface, that is, the bonding insulating layer 130b, of the first encapsulant 130.

Since the bonding insulating layer 130b is in a non-hardened state, for example, in a B-stage, the redistribution patterns 162 formed to be convex as compared to a surface of the temporary support 320 may be embedded in the surface of the bonding insulating layer 130b by a lamination process. When the lamination process is used, it may be performed in a manner of performing a hot press process of pressing the redistribution pattern for a predetermined time at a high temperature, decompressing the redistribution pattern, and cooling the redistribution pattern to room temperature, and then additionally cooling the redistribution pattern in a cold press.

Figure 13F:
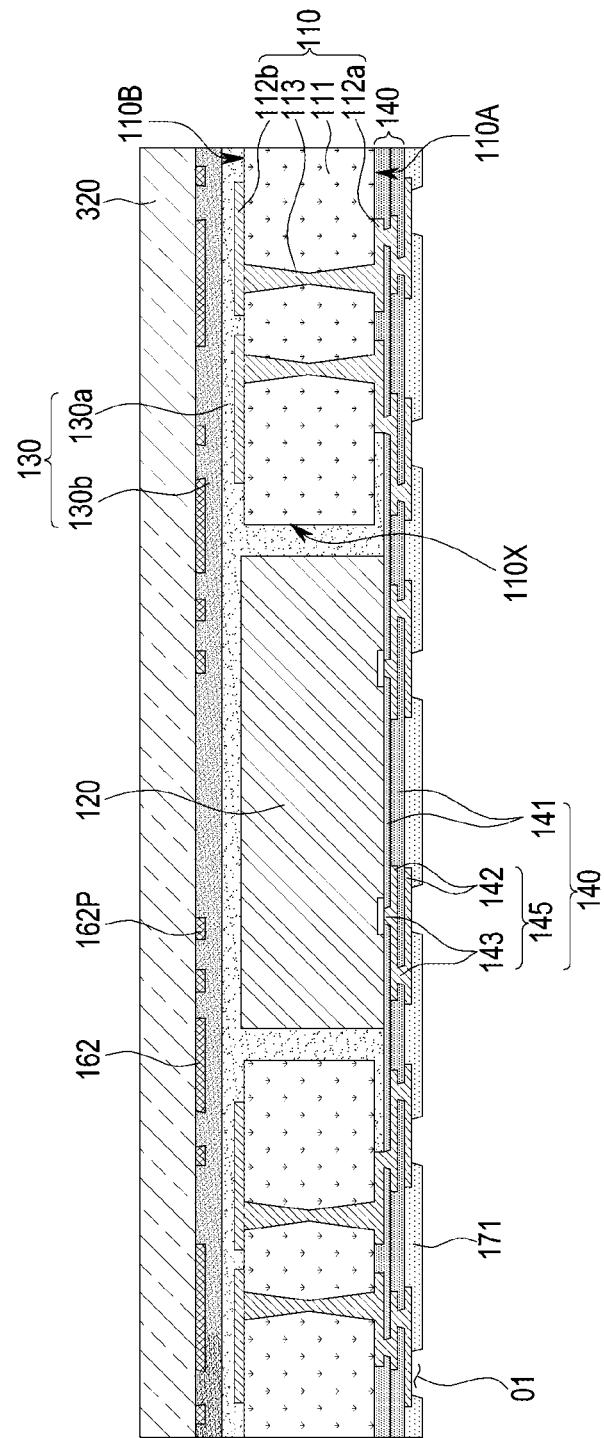

Then, referring to FIG. 13F, the adhesive support 310 may be removed from the frame 110 and the first semiconductor chip 120, and the first connection structure 140 may then be formed.

The present removing process is not particularly limited, and may be performed by various methods. For example, when the thermosetting adhesive tape of which the adhesion is weakened by the heat treatment, the ultraviolet-curable adhesive tape of which the adhesion is weakened by the ultraviolet ray irradiation, or the like, is used as the adhesive support 310, the adhesive support 310 may be removed after the adhesion of the adhesive support 310 is weakened by heat-treating the adhesive support 310 or may be removed after the adhesion of the adhesive support 310 is weakened by irradiating the adhesive support 310 with an ultraviolet ray. As described above, the temporary support 320 may be used as a support in a process of forming the first redistribution layer 145.

The first connection structure 140 including the first redistribution layers 145 may be formed beneath the frame 110 and on the lower surface of the first semiconductor chip 120, and the first passivation layer 140 may be formed beneath the first connection structure 140.

Figure 15A:
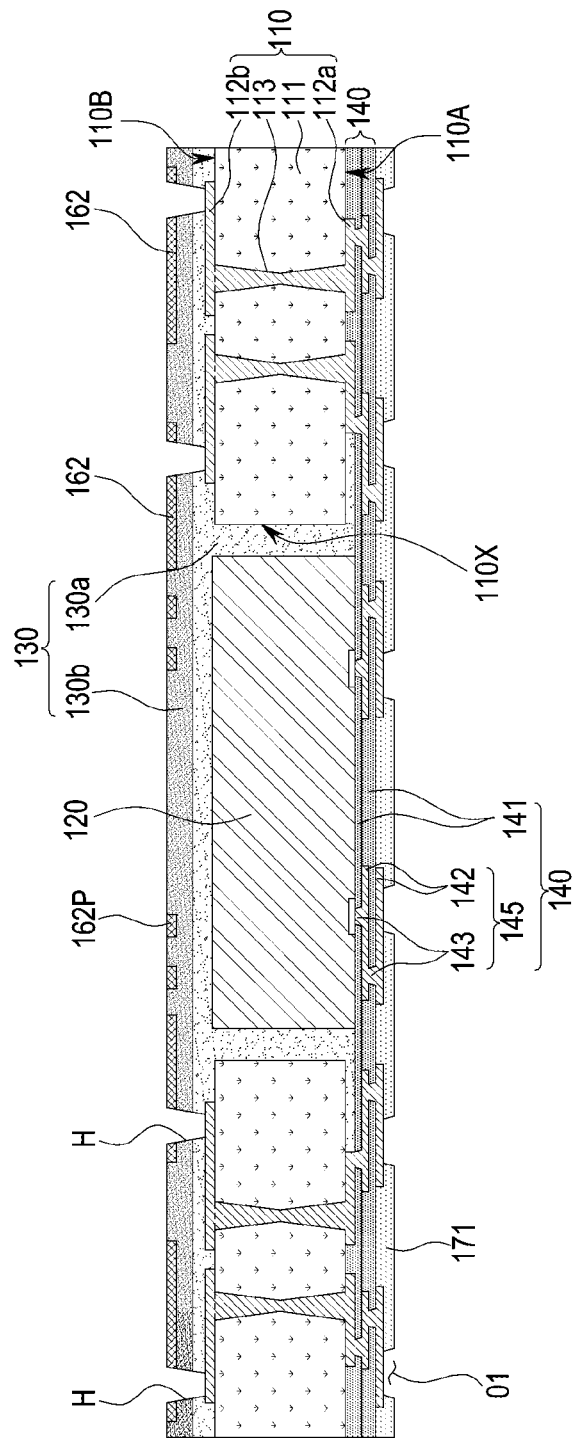
FIGS. 15A through 15C are cross-sectional views for describing main processes (a process of forming connection vias) of the method of manufacturing the semiconductor package illustrated in FIG. 9.
Figure 15B:
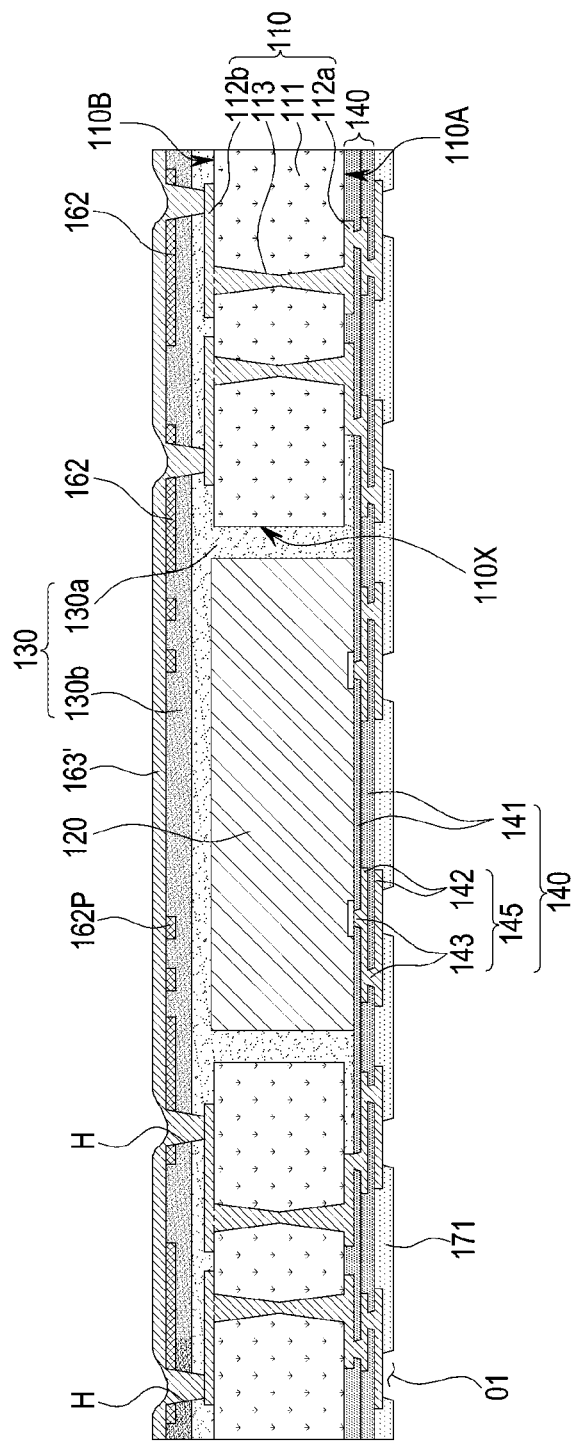
Figure 15C:
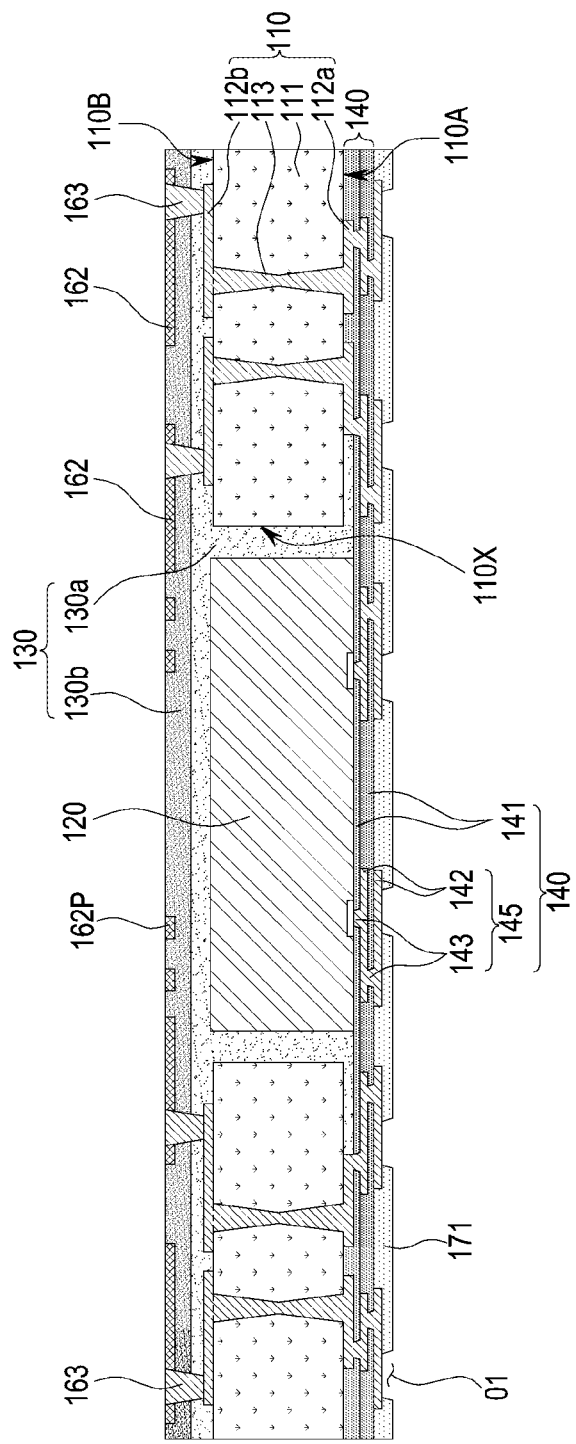

After the processes described above are performed, a process of forming the second redistribution layer 165 disposed on the second surface 110B of the frame 110 may be performed. In detail, a process of forming the connection vias connecting the embedded second redistribution pattern to the wiring structure (particularly, the second wiring pattern 112b) may be performed. FIGS. 15A through 15C are cross-sectional views for describing main processes (a process of forming connection vias) of connecting a second redistribution layer in the method of manufacturing the semiconductor package illustrated in FIG. 9.

First, referring to FIG. 15A, the temporary support 320 may be removed from the surface of the first encapsulant 130, and holes H exposing the second wiring pattern 112b in the openings R of the redistribution pattern 162 having the ring shape may then be formed.

The temporary support 320 may be removed so that the embedded redistribution pattern 162 remains in the surface of the first encapsulant 130. The temporary support 320 may be easily removed using a separating member such as the release layer described above, or the like. A process of removing the temporary support 320 may be easily performed after adhesion of the temporary support 320 is weakened using heat treatment, an ultraviolet ray, or the like, depending on characteristics of the temporary support or the release layer.

The holes H may expose the second wiring pattern 112b in the openings R of the redistribution pattern 162. For example, a process of forming the holes H may be performed using a laser drill and/or a laser drill. After a drill process is performed, a desmear process may be performed by a permanganate method, or the like, to remove a resin smear.

Then, referring to FIG. 15B, a plating layer 163' may be formed on the first encapsulant 130 so as to fill inner portions of the holes H.

The present process may be obtained by forming a seed layer (not illustrated) on the surface of the first encapsulant 130 as well as inner surfaces of the holes H and then forming the plating layer 163' by a plating process using the seed layer. The plating layer 163' formed as described above may fill inner spaces of the holes H.

Then, referring to FIG. 15C, portions of the plating layer disposed on the first encapsulant 130 and the redistribution pattern 162 may be removed so that the connection vias 163 are formed.

Such a removing process may be performed by a planarization process such as an etch back or grinding process. Portions of the plating layer remaining in the holes H may be provided as the connection vias 163. The connection vias 163 may connect the second wiring pattern 112b of the wiring structure and the redistribution pattern 162 to each other. The connection vias 163 may provide a desired second redistribution layer 165 together with the redistribution pattern 162. The exposed surface of the second redistribution pattern 162 may be substantially coplanar with the surface of the first encapsulant 130 by the present process. In the present exemplary embodiment, the connection via 163 may have an upper surface substantially coplanar with the exposed surface of the second redistribution pattern 162, or may have a recessed upper surface 163T as illustrated in FIG. 11A even after the planarization process.

After the first connection structure 140 including the first redistribution layers 145 is formed beneath the frame 110 and on the lower surface of the first semiconductor chip 120, the first passivation layer 171 may be formed beneath the first connection structure 140, and the first openings O1 exposing the redistribution pattern 142 may be formed. A material of the first passivation layer 171 is not particularly limited, and may be, for example, a solder resist. In some exemplary embodiments, a material (for example, a PID resin, an ABF, or the like) that is the same as or similar to the insulating material used for the frame 110 and/or the insulating layer 141 of the first connection structure 140 may be used as the material of the first passivation layer 171.

FIGS. 16A through 16C are cross-sectional views for describing main processes (a process of mounting a second semiconductor chip) of the method of manufacturing the semiconductor package illustrated in FIG. 9.

Referring to FIG. 16A, the second passivation layer 172 may be formed on the first encapsulant 130, and the second openings O2 exposing the pad regions 162P may be formed.

The second passivation layer 172 may be configured to protect the second redistribution layer 165 from external physical or chemical damage, and may be formed of an insulating material. The second passivation layer 172 may be applied using an insulating material similar to that of the first passivation layer described above, and the second openings O2 exposing portions of the redistribution pattern 162, that is, the pad regions 162P may then be formed.

Referring to FIG. 16B, the second semiconductor chip 220 may be mounted on the second connection structure 160, and the connection pads 220P of the second semiconductor chip 220 and the pad regions 162P may be connected to each other.

In the present exemplary embodiment, a form in which the second semiconductor chip 220 is flip-chip-bonded in a face down manner is exemplified. The second semiconductor chip 220 may be disposed on a level above the second openings O2. The underfill material 210 may be filled between the second semiconductor chip 220 and the second connection structure 160. The connection pads 220P of the second semiconductor chip 220 may be connected to the pad regions 162P, respectively, by the bumps CB formed of copper. The second semiconductor chip 220 may be connected to the second redistribution layer 165 through the pad regions 162P.

Referring to FIG. 16C, the second encapsulant 230 encapsulating the second semiconductor chip may be formed, and the electrical connection metals 190 may be formed in the first openings O1 of the first passivation layer 171.

The second encapsulant 230 may be disposed on the second passivation layer 172 and may encapsulate the second semiconductor chip 220. The second encapsulant 230 may include a material that is the same as or similar to the insulating material of the first encapsulant 130. The electrical connection metals 190 may be connected to the redistribution pattern 142 exposed by the first openings O1, the additional underbump metal layers 180 may be formed on the redistribution pattern 142, and the electrical connection metals 190 may be formed.

Figure 17:
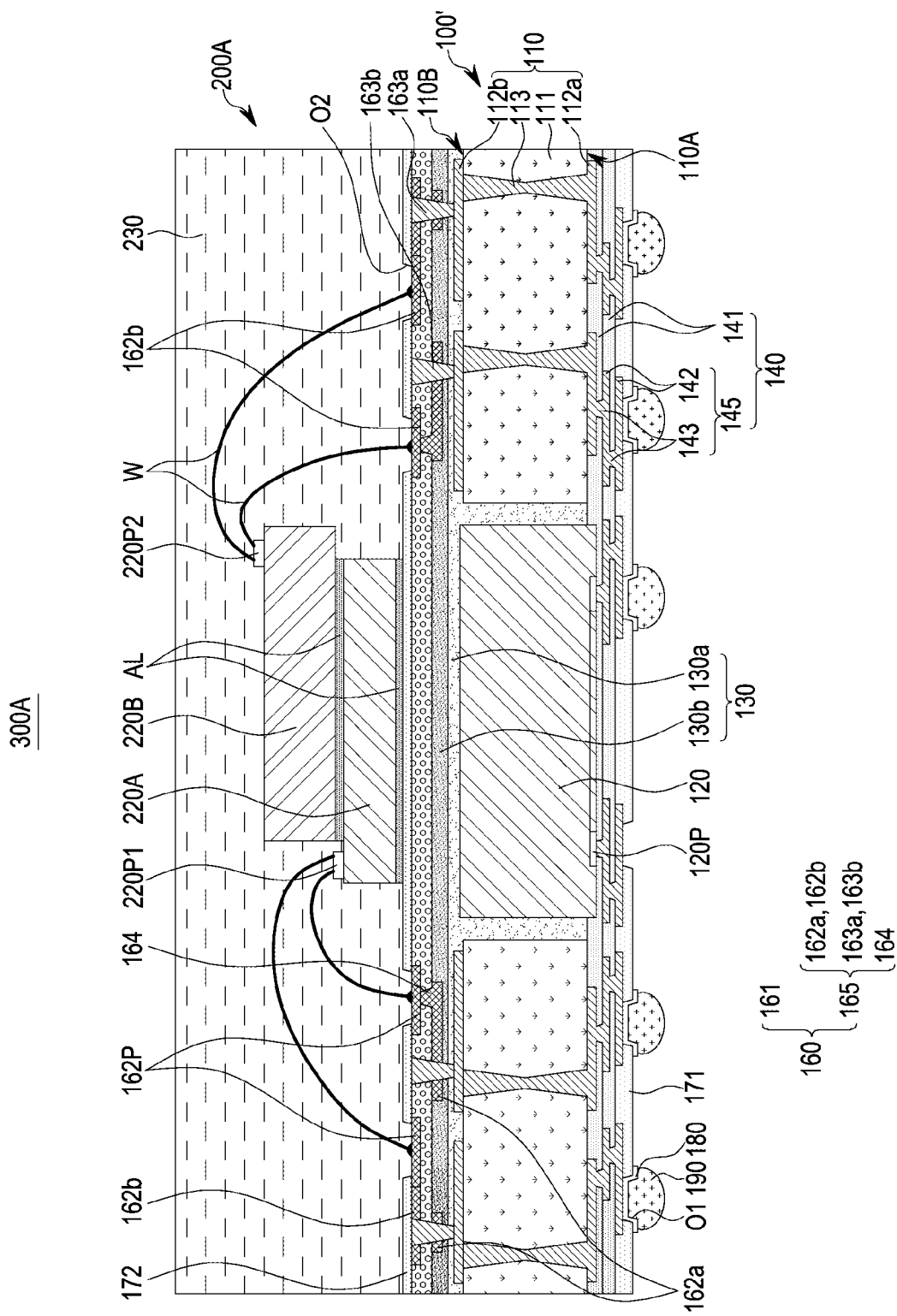
FIGS. 17 and 18 are side cross-sectional views illustrating semiconductor packages according to various exemplary embodiments in the present disclosure.

FIG. 17 is a side cross-sectional view illustrating a semiconductor package according to an exemplary embodiment in the present disclosure.

Referring to FIG. 17, it may be understood that a semiconductor package 300A according to the present exemplary embodiment is similar to the semiconductor package 300 illustrated in FIGS. 9 through 12 except that a second connection structure 160 includes an insulating layer 161 and a second redistribution layer 165 having a two-level structure and except for a type and a connection structure of a second semiconductor chip. Components according to the present exemplary embodiments may be understood with reference to the description for the same or similar components of the semiconductor package 300 illustrated in FIGS. 9 through 12 unless explicitly described otherwise.

The second connection structure 160 used in the present exemplary embodiment may include a first redistribution pattern 162*a* embedded in a first encapsulant 130 and having one surface exposed, the insulating layer 161 having a first surface in contact with the exposed surface of the first redistribution pattern 162*a* and an upper surface of the first encapsulant 130, and a second redistribution pattern 162*b* embedded in the second surface of the insulating layer 161 and having one surface exposed.

The second redistribution layer 165 may include connection vias 163*a* and 163*b* penetrating through the insulating layer 161 and the first encapsulant 130 and interlayer vias 164 penetrating through the insulating layer 161 and connecting the first and second redistribution patterns 162*a* and 162*b* to each other.

The connection vias may be divided into several types of connection vias 163*a* and 163*b* depending on redistribution patterns to which they are connected. The connection vias may be formed by forming holes connected to desired redistribution patterns after a lamination process and performing plating and planarization processes, similar to the processes illustrated in FIGS. 15A and 15C.

Second connection vias 163*b* may connect the first redistribution pattern 162*a* and a second wiring pattern 112*b* to each other, and may penetrate through the insulating layer 161, but may not be connected to the second redistribution pattern 162*b*. First connection vias 163*a* may connect both of the first and second redistribution patterns 162*a* and 162*b* and the second wiring pattern 112*b* to each other. In addition, the second redistribution layer 165 may further include third connection vias (not illustrated) that are connected to the second redistribution pattern 162*b* and the second wiring pattern 112*b* and are not connected to the first redistribution pattern 162*a*.

The interlayer vias 164 may not extend up to the first encapsulant 130 and may be configured to penetrate through the insulating layer 161, unlike the first and second connection vias 163*a* and 163*b*. The interlayer via 164 may have an integrated structure with the first redistribution pattern 162*a*. In the present specification, a term "integrated structure" does not mean that two components are simply in contact with each other, and refers to a structure in which two components are formed integrally with each other using the same material by the same process. That is, the interlayer via 164 and the first redistribution pattern 162*a* may be considered as having the "integrated structure" in which they are simultaneously formed by the same plating process.

The first and second connection vias 163*a* and 163*b* and the interlayer vias 164 may be formed in opposite directions to each other. The interlayer vias 164 may be formed in advance in a process of forming the second connection structure on another temporary support 320 (see FIG. 13D) before a lamination process. In detail, the second redistribution pattern 162*b* may be formed on the temporary support, the insulating layer 161 may be formed to cover the second redistribution pattern 162*b*, and the interlayer vias 164 may be formed together with the first redistribution pattern 162*a* so as to penetrate through the insulating layer 161 and be connected to the second redistribution pattern 162*b*. Therefore, the interlayer vias 164 may have a greater width in a portion thereof in contact with the first redistribution pattern 162*a* than in a portion thereof in contact with the second redistribution pattern 162*b*.

To the contrary, the first and second connection vias 163*a* and 163*b* may have a greater width in portions thereof in contact with the second redistribution pattern 162*b* than in portions thereof adjacent to the second surface of the insulating layer 161.

The second redistribution layer that may be used in the present exemplary embodiment is not limited to the redistribution layer having the two-level structure, and may be implemented in a three-level or more structure by including two or more insulating layers.

The second semiconductor chip used in the present exemplary embodiment may include two or more semiconductor chips 220A and 220B that are stacked. The stacked semiconductor chips 220A and 220B may be connected to pad regions 162P by wires W. The stacked semiconductor chips 220A and 220B may be bonded to each other while being bonded to a lower package 100' by an adhesive layer AL. For example, the stacked semiconductor chips 220A and 220B may include memory chips such as DRAMs.

The first and second semiconductor chips 220A and 220B may include various combinations of memory chips and/or logic chips. For example, the memory chip may be a volatile memory chip such as a DRAM or a static random access memory (SRAM) or a non-volatile memory chip such as a phase-change random access memory (PRAM), a magnetoresistive random access memory (MRAM), a ferroelectric random access memory (FeRAM), or a resistive random access memory (RRAM). In addition, the logic chip may be, for example, a microprocessor, an analog element, or a digital signal processor.

Figure 18:
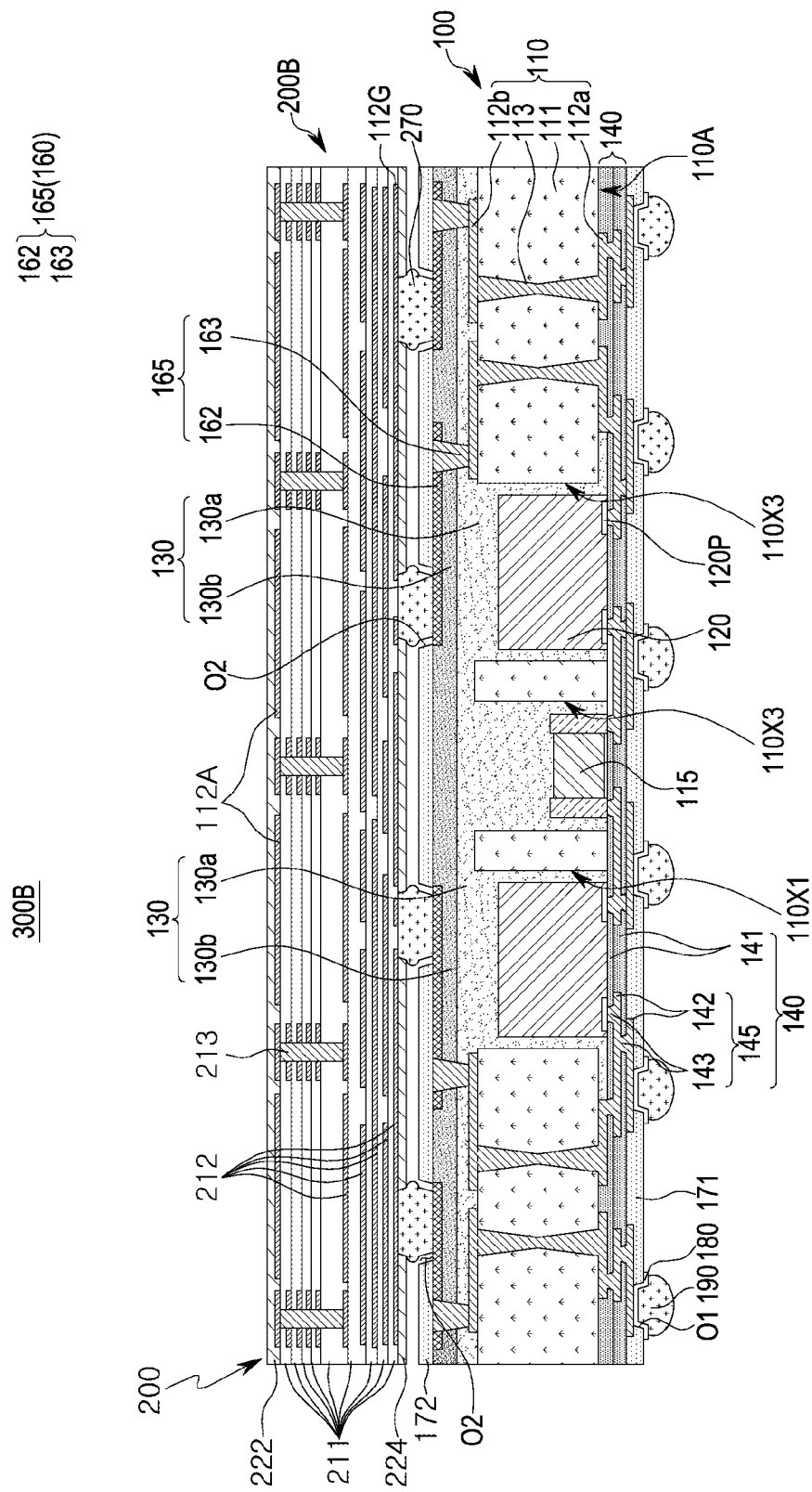

FIG. 18 is a side cross-sectional view illustrating a semiconductor package according to an exemplary embodiment in the present disclosure.

Referring to FIG. 18, it may be understood that a semiconductor package 300B according to the present exemplary embodiment is similar to the semiconductor package 300 illustrated in FIGS. 9 through 12 except that it includes another functional substrate (for example, an antenna substrate) instead of the upper package including the second semiconductor chip. Components according to the present exemplary embodiments may be understood with reference to the description for the same or similar components of the semiconductor package 300 illustrated in FIGS. 9 through 12 unless explicitly described otherwise.

The semiconductor package 300B according to the present exemplary embodiment may include the antenna substrate instead of the upper package structure. The antenna substrate 200, a region capable of implementing a millimeter wave/5G antenna, may include substrate wiring layers 212 including antenna patterns and ground patterns. In detail, the antenna substrate 200 may include substrate insulating layers 211, the substrate wiring layers 212, connection via layers 213, and substrate passivation layers 222 and 224.

A lower package 100 may include a plurality of passive components 125 disposed in a first cavity 110X1 of a frame 110 and first and second semiconductor chips 120A and 120B disposed, respectively, in second and third cavities 110X2 and 110X3 of the frame 110. For example, the first and second semiconductor chips 120A and 120B may include a radio frequency integrated circuit (RFIC) and a power management integrated circuit (PMIC), respectively, and the plurality of passive components 125 may include capacitors, inductors, or the like.

In the present exemplary embodiment, the lower package 100 and the antenna substrate 200B may be physically and/or electrically connected to each other by electrical connection metals 270. Each of the electrical connection metals 270 may be formed of a low melting point metal, for example, tin (Sn) or an alloy including tin (Sn), more specifically, a solder. However, this is only an example, and a material of each of the electrical connection metals 270 is not particularly limited thereto.

As described above, the semiconductor package according to the present exemplary embodiment may be provided as various modules having a structure similar to a PoP structure by being coupled to another functional substrate such as the antenna substrate, in addition to a semiconductor package having a typical PoP structure.

As set forth above, according to an exemplary embodiment in the present disclosure, a semiconductor package having a package-on-package structure may be provided in a manner of separately manufacturing a backside redistribution structure and then laminating an upper package structure on a lower package structure, such that a thickness of the semiconductor package may be reduced, and electrical reliability (for example, transmission efficiency) and/or heat dissipation performance of the semiconductor package may be significantly improved.

While exemplary embodiments have been shown and described above, it will be apparent to those skilled in the art that modifications and variations could be made without departing from the scope of the present invention as defined by the appended claims.

What is claimed is:

1. A semiconductor package comprising:
a frame having a cavity and including a wiring structure connecting first and second surfaces of the frame, the first and second surfaces opposing each other;
a first connection structure disposed on the first surface of the frame and including a first redistribution layer connected to the wiring structure;
a first semiconductor chip disposed on the first connection structure within the cavity and having connection pads connected to the first redistribution layer;
a first encapsulant encapsulating the first semiconductor chip and covering the second surface of the frame;
a second connection structure including a second redistribution layer including a first redistribution pattern and a first connection via, the first redistribution pattern being embedded in the first encapsulant and having one surface exposed from the first encapsulant, and the first connection via penetrating through the first encapsulant and connecting the wiring structure and the first redistribution pattern to each other; and
a second semiconductor chip disposed on the second connection structure and having connection pads connected to the second redistribution layer,
wherein the first encapsulant includes an encapsulating insulating layer encapsulating the first semiconductor chip and covering the second surface of the frame and a bonding insulating layer disposed on the encapsulating insulating layer and embedding the first redistribution pattern therein so that the one surface of the first redistribution pattern is exposed from the bonding insulating layer,
the bonding insulating layer has an upper surface substantially coplanar with the exposed surface of the first redistribution pattern, and the encapsulating insulating layer is provided between the bonding insulating layer and the first semiconductor chip.

2. The semiconductor package of claim 1, further comprising a passivation layer disposed on the second connection structure and having openings exposing partial regions of the second redistribution layer,
wherein the connection pads of the second semiconductor chip are connected to the partial regions of the second redistribution layer through the openings.

3. The semiconductor package of claim 2, wherein the partial regions of the second redistribution layer contain a plurality of pads, and
the second semiconductor chip is disposed on the openings, and the connection pads of the second semiconductor chip are connected to the plurality of pads, respectively.

4. The semiconductor package of claim 2, wherein the second semiconductor chip is disposed on the passivation layer, and the connection pads of the second semiconductor chip are connected to the partial regions of the second redistribution layer by wires.

5. The semiconductor package of claim 2, further comprising a second encapsulant disposed on the passivation layer and encapsulating the second semiconductor chip.

6. The semiconductor package of claim 1, wherein the first redistribution pattern includes a land having an opening, and
the first connection via penetrates through the opening of the first redistribution pattern.

7. The semiconductor package of claim 1, wherein the first connection via is connected to one end of the first redistribution pattern and penetrates through the first encapsulant.

8. The semiconductor package of claim 1, wherein the first connection via has a greater width in a portion thereof in contact with the first redistribution pattern than in a portion thereof in contact with the wiring structure.

9. A semiconductor package comprising:
a frame having a cavity and including a wiring structure connecting first and second surfaces of the frame, the first and second surfaces opposing each other;
a first connection structure disposed on the first surface of the frame and including a first redistribution layer connected to the wiring structure;
a first semiconductor chip disposed on the first connection structure within the cavity and having connection pads connected to the first redistribution layer;
a first encapsulant encapsulating the first semiconductor chip and covering the second surface of the frame;
a second connection structure including a second redistribution layer including a first redistribution pattern and a first connection via, the first redistribution pattern being embedded in the first encapsulant and having one surface exposed from the first encapsulant, and the first connection via penetrating through the first encapsulant and connecting the wiring structure and the first redistribution pattern to each other; and
a second semiconductor chip disposed on the second connection structure and having connection pads connected to the second redistribution layer,
wherein the second connection structure further includes an insulating layer having a first surface in contact with the exposed surface of the first redistribution pattern and an upper surface of the first encapsulant and a second surface opposing the first surface of the insulating layer, and the second redistribution layer further includes a second redistribution pattern embedded in the second surface of the insulating layer and having one surface exposed from the second surface of the insulating layer, and an interlayer via penetrating through the insulating layer and connecting the first and second redistribution patterns to each other, and the first connection via extend to penetrate through the insulating layer.

10. The semiconductor package of claim 9, wherein the interlayer via has an integrated structure with the first redistribution pattern.

11. The semiconductor package of claim 9, wherein the interlayer via has a greater width in a portion thereof in contact with the first redistribution pattern than in a portion thereof in contact with the second redistribution pattern.

12. The semiconductor package of claim 9, wherein the first connection via is connected to the second redistribution pattern.

13. The semiconductor package of claim 12, further comprising a third connection via penetrating through the first encapsulant and the insulating layer, and connecting the wiring structure and the first redistribution pattern to each other,
wherein the third connection via is spaced apart from the second redistribution pattern.

14. The semiconductor package of claim 9, further comprising a fourth connection via penetrating through the insulating layer and the first encapsulant and connected to the second redistribution pattern and the wiring structure, and
the fourth connection via is spaced apart from the first redistribution pattern.

15. A semiconductor package comprising:
a first semiconductor chip having an active surface having connection pads disposed thereon and an inactive surface opposing the active surface;
a first connection structure disposed on the active surface of the first semiconductor chip and including a first redistribution layer connected to the connection pads;
an encapsulant disposed on the first connection structure and encapsulating the first semiconductor chip;
a wiring structure penetrating through the encapsulant and connected to the first redistribution layer;
a second connection structure including a second redistribution layer having a first redistribution pattern and a connection via, the first redistribution pattern being embedded in the encapsulant and having one surface exposed from the encapsulant, and the connection via penetrating through the encapsulant and connecting the wiring structure and the first redistribution pattern to each other; and
a second semiconductor chip disposed on the second connection structure and having connection pads connected to the second redistribution layer,
wherein the first encapsulant includes an encapsulating insulating layer encapsulating the first semiconductor chip and a bonding insulating layer disposed on the encapsulating insulating layer and embedding the first redistribution pattern therein so that the one surface of the first redistribution pattern is exposed from the bonding insulating layer,
the bonding insulating layer has an upper surface substantially coplanar with the exposed surface of the first redistribution pattern, and
the encapsulating insulating layer is provided between the bonding insulating layer and the first semiconductor chip.

16. The semiconductor package of claim 15, wherein the connection via has a greater width in a portion thereof in contact with the first redistribution pattern than in a portion thereof in contact with the wiring structure.

17. The semiconductor package of claim 15, wherein the second connection structure further includes an insulating layer having a first surface in contact with the exposed surface of the first redistribution pattern and an upper surface of the first the encapsulant and a second surface opposing the first surface of the insulating layer, and
the second redistribution layer further includes a second redistribution pattern embedded in the second surface of the insulating layer and having one surface exposed from the second surface of the insulating layer, and an interlayer via penetrating through the insulating layer and connecting the first and second redistribution patterns to each other.

18. The semiconductor package of claim 17, wherein the connection via extend to penetrate through the insulating layer, and
the connection via and the interlayer via are tapered in opposite directions.

* * * * *